United States Patent
Katti

(10) Patent No.: US 10,056,126 B1
(45) Date of Patent: Aug. 21, 2018

(54) MAGNETIC TUNNEL JUNCTION BASED MEMORY DEVICE

(71) Applicant: Honeywell International Inc., Morris Plains, NJ (US)

(72) Inventor: Romney R. Katti, Shorewood, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/796,003

(22) Filed: Oct. 27, 2017

(51) Int. Cl.
| G11C 11/16 | (2006.01) |
| G01R 33/09 | (2006.01) |
| H01L 43/12 | (2006.01) |
| H01L 43/08 | (2006.01) |

(52) U.S. Cl.
CPC .......... *G11C 11/161* (2013.01); *G01R 33/093* (2013.01); *G11C 11/1675* (2013.01); *H01L 43/08* (2013.01); *H01L 43/12* (2013.01)

(58) Field of Classification Search
CPC . G11C 11/161; G11C 11/1675; G01R 33/093; H01L 43/08; H01L 43/12
See application file for complete search history.

(56) References Cited

U.S. PATENT DOCUMENTS

| 7,514,271 | B2 | 4/2009 | Gaidis et al. |
| 7,663,197 | B2 | 2/2010 | Nagase et al. |
| 7,738,278 | B2 | 6/2010 | Kim et al. |
| 7,869,266 | B2 | 1/2011 | Ranjan et al. |
| 8,120,127 | B2 | 2/2012 | Nagahara et al. |
| 8,120,950 | B2 | 2/2012 | Fukami et al. |
| 8,270,204 | B2 | 9/2012 | Wang et al. |
| 8,300,456 | B2 | 10/2012 | Honjou et al. |
| 8,315,087 | B2 | 11/2012 | Katou et al. |
| 8,374,020 | B2 | 2/2013 | Katti |
| 8,379,429 | B2 | 2/2013 | Ishiwata et al. |
| 8,416,611 | B2 | 4/2013 | Fukami et al. |
| 8,559,214 | B2 | 10/2013 | Fukami et al. |
| 8,648,401 | B2 | 2/2014 | Lai et al. |
| 8,649,214 | B2 | 2/2014 | Apalkov et al. |
| 8,923,039 | B2 | 12/2014 | Annunziata et al. |

(Continued)

FOREIGN PATENT DOCUMENTS

EP   2804180 A1   5/2013

OTHER PUBLICATIONS

Wang, et al., "Spintronic Memristor Devices and Application," Mar. 2010 EDAA, 6 pp.

(Continued)

*Primary Examiner* — Ajay Ojha
(74) *Attorney, Agent, or Firm* — Shumaker & Sieffert, P.A.

(57) ABSTRACT

A magnetic tunnel junction based memory device comprising a magnetic tunnel junction element and writing circuitry. The magnetic tunnel junction element includes a free layer, a pinned layer, and a tunnel barrier. The free layer is spaced apart along a vertical direction from the pinned layer by the tunnel barrier. The writing circuitry is configured to receive an instruction to set the magnetic tunnel junction element to a target state of three of more states of the magnetic tunnel junction element and provide electrical current to modify a position of a domain wall of the free layer along both a first horizontal direction and a second horizontal direction to correspond to the target state.

20 Claims, 14 Drawing Sheets

(56) References Cited

U.S. PATENT DOCUMENTS

| | | | |
|---|---|---|---|
| 9,276,197 B2 | 3/2016 | Johnson et al. | |
| 9,379,312 B2 | 6/2016 | Sugibayashi et al. | |
| 2006/0221677 A1* | 10/2006 | Klaeui | G11C 11/15 365/158 |
| 2007/0194359 A1* | 8/2007 | Lim | G11C 11/15 257/295 |
| 2007/0242505 A1* | 10/2007 | Ochiai | G11C 11/14 365/171 |
| 2014/0062530 A1 | 3/2014 | Miao et al. | |

OTHER PUBLICATIONS

Bahri, et al., "Geometrically pinned magnetic domain wall for multi-bit per cell storage memory," Scientific Reports, www.nature.com/scientificreports, Jun. 23, 2016, 8 pp.

Boulle, et al. "Current-induced domain wall motion in nanoscale ferromagnetic elements," Materials Science and Engineering R, Science Direct, Jun. 2011, pp. 159-187.

Lei, et al., "Electric field control of domain wall logic in piezoelectric/ferromagnetic nanodevices," Jan. 2012.

Sengupta, et al., "Proposal for an All-Spin Artificial Neural Network: Emulating Neural and Synaptic Functionalities Through Domain Wall Motion in Ferromagnets," IEEE, Feb. 3, 2016, 9 pp.

* cited by examiner

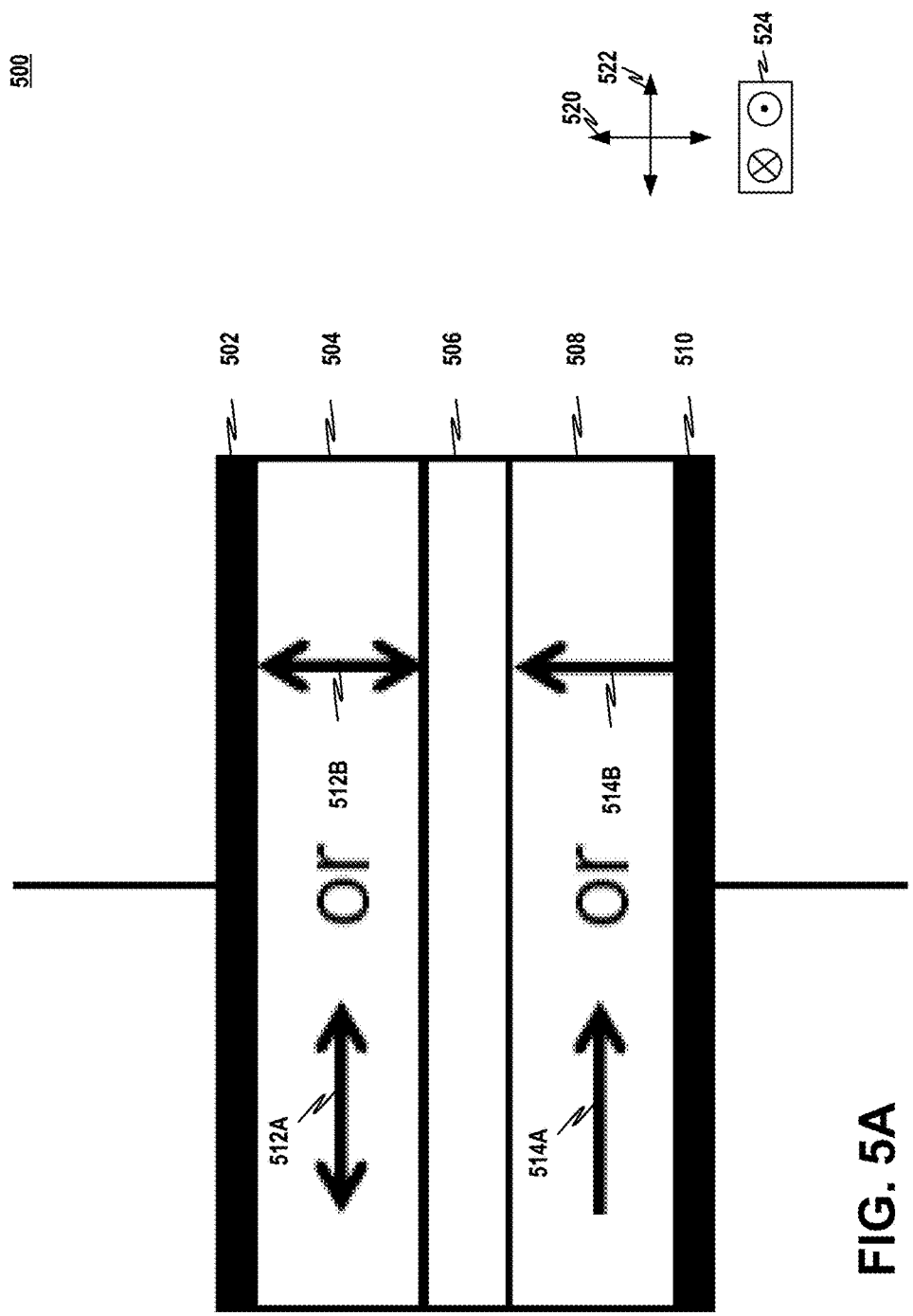

MAGNETIC TUNNEL JUNCTION BASED MEMORY DEVICE

TECHNICAL FIELD

This disclosure relates to memory devices and, more specifically, to magnetic tunnel junction based devices that are configured for three or more states.

BACKGROUND

Most modern electronic devices include a power source, components for storing data, components for processing data, components for receiving user input, and components for delivering user output. It is desirable for such electronic devices to have long battery life, powerful processing capabilities, and large amounts of data storage, but at the same time, it is also desirable for electronic devices to maintain small and lightweight form factors. To meet these conflicting demands, it is desirable for the components of these devices to become smaller with better performance.

It is generally desirable for memory components, for example, to store more data in a smaller space with faster read and write operations. Current types of non-volatile memory include electro-mechanical hard drives where read/write heads read and write data from and to a series of rotating disks. Other types of non-volatile memory include solid state memories that use transistors and other devices (e.g., capacitors, floating gate MOSFETs, etc.) to store data without any moving parts and with faster read and write access.

SUMMARY

This disclosure generally describes techniques for writing data to a magnetic tunnel junction based memory device. The techniques may in some instances provide for a higher data density for a smaller and more lightweight form factor. Furthermore, magnetic tunnel junction memory elements in the memory magnetic tunnel junction based memory device may store non-binary data, e.g., a magnetic tunnel junction memory element may have more three or more states, which may be of particular benefit to certain applications.

In one example, a method of performing a write operation on a multi-state memory device includes receiving, by writing circuitry, an instruction to set a magnetic tunnel junction element to a target state of three of more states of the magnetic tunnel junction element. The magnetic tunnel junction element includes a free layer, a pinned layer, and a tunnel barrier. The free layer is spaced apart along a vertical direction from the pinned layer by the tunnel barrier. The method further includes providing, by the writing circuitry, electrical current to modify a position of a domain wall of the free layer along both a first horizontal direction and a second horizontal direction to correspond to the target state. The vertical direction is perpendicular to the first horizontal direction and the second horizontal direction, and the first horizontal direction is perpendicular to the second horizontal direction.

In another example, a magnetic tunnel junction based memory device includes a magnetic tunnel junction element and writing circuitry. The magnetic tunnel junction element includes a free layer, a pinned layer, and a tunnel barrier. The free layer is spaced apart along a vertical direction from the pinned layer by the tunnel barrier. The writing circuitry is configured to receive an instruction to set the magnetic tunnel junction element to a target state of three of more states of the magnetic tunnel junction element and provide electrical current to modify a position of a domain wall of the free layer along both a first horizontal direction and a second horizontal direction to correspond to the target state. The vertical direction is perpendicular to the first horizontal direction and the second horizontal direction, and the first horizontal direction is perpendicular to the second horizontal direction.

In another example, a magnetic tunnel junction based memory device includes means for receiving an instruction to set a magnetic tunnel junction element to a target state of three of more states of the magnetic tunnel junction element. The magnetic tunnel junction element includes a free layer, a pinned layer, and a tunnel barrier, the free layer being spaced apart along a vertical direction from the pinned layer by the tunnel barrier. The device further includes means for providing electrical current to modify a position of a domain wall of the free layer along both a first horizontal direction and a second horizontal direction to correspond to the target state. The vertical direction is perpendicular to the first horizontal direction and the second horizontal direction, and the first horizontal direction is perpendicular to the second horizontal direction.

The details of one or more aspects of the disclosure are set forth in the accompanying drawings and the description below. Other features, objects, and advantages of the devices, systems, methods, and techniques described in this disclosure will be apparent from the description and drawings, and from the claims.

BRIEF DESCRIPTION OF DRAWINGS

FIG. 5A shows a conceptual illustration of a side view of a fourth magnetic tunnel junction element according to the current disclosure.

DETAILED DESCRIPTION

Figure 1A:
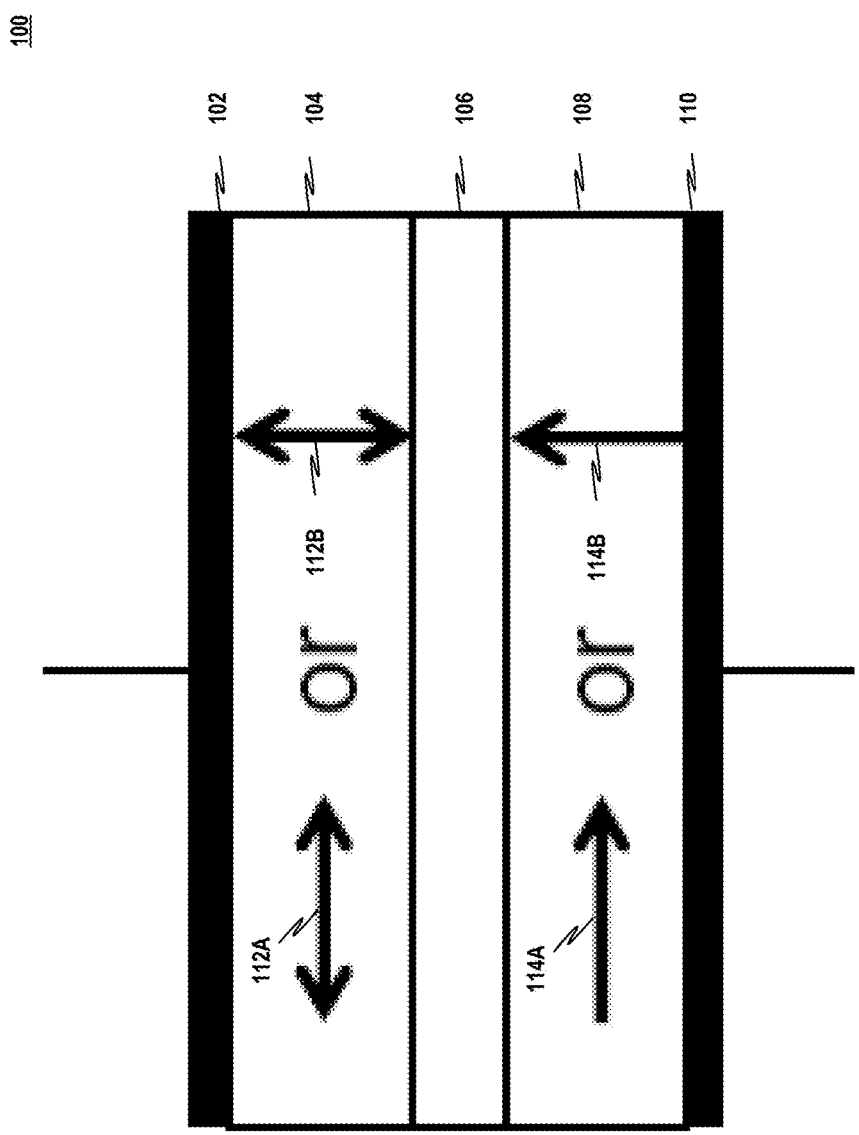
FIG. 1A shows a conceptual illustration of a magnetic tunnel junction element configured to represent a digital bit value.

As computing technology continues to advance a need has emerged to enable analog and neuromorphic computing for trusted applications as well as for space applications. Analog and neuromorphic computation may benefit from a class of analog memory and data storage devices that complement digital and/or binary memory. Moreover, analog and neuromorphic computation data storage devices may further benefit from memories that are technologically similar for platform commonality, productization, qualification, and leverage purposes. Devices with ever-greater miniaturization and efficiency are desired to reduce Size, Weight, and Power consumption (SWaP). Realizing a magnetic memristor may offer functionality that is technologically compatible and similar to magnetics technologies and products, such as MRAM (Magneto-resistive Random Access Memory) that support space and strategic applications with radiation hardness and high levels of write endurance, read endurance, and data retention.

The need is also emerging, in parallel, to accommodate neuromorphic computing and computational algorithms. Examples of such applications include rapid terrain data processing, target identification, and machine learning. Having memory and data storage devices that can support analog, multi-level, and neuromorphic computing with commonality may enable strategic and space applications. For example, rather than using a first memory device that supports only analog computing, using a second memory device that supports only multi-level computing, and using a third memory device that supports only neuromorphic computing, memory devices described herein may support any combination of analog, multi-level, and neuromorphic computing. As such, systems using one or more memory devices described herein may permit additional applications than systems that use different memory and data storage devices for each one of analog, multi-level, and neuromorphic computing.

A high performance memristor may offer many levels of analog and/or multi-state storage and high levels of write endurance, read endurance, and data retention. Examples described herein for computing hardware may also support connectivity, IoT, and advanced software applications in a variety of configurations.

Examples described herein for magnetic and/or spintronic devices for neuromorphic architectures and memristor applications differentiate from charge-based non-magnetic technologies. Such devices also differentiate from current-day magnetic and/or spintronic devices used in digital storage and memory technologies and magnetic sensors which are typically applied as mainstream high volume technologies. These devices have potential application in current applications and/or in future/emergent approaches/applications that could potentially be high-volume. Such a magnetic device, given the advancement in the state of magnetic tunnel junction (MTJ) technology including inductive and spin-transfer and resistive and magneto-resistive effects, appears to offer nonvolatile neuromorphic and memristor capability with good endurance, good data retention, and low power consumption.

This disclosure describes magnetic tunnel junctions, in which the free layer, which in digital computing is typically used to store binary states, is designed for use in analog/neuromorphic computing as a magnetic layer in which a domain wall is present and can be propagated and stabilized. As the domain wall is swept and placed across the free layer the resulting net magnetization in the free layer allows the resistance of the magnetic tunnel junction to take on a range of resistances, and thus provide multi-state and analog level storage to support analog and neuromorphic computing. The choice of the material for the free layer can be used to control domain wall propagation and stability characteristics. One or more axes can be used. Structures, including stabilization components, can additionally be placed in association with the free layer to stabilize the domain wall at specific locations, such as with magneto-static effects, whether through physical geometry modifications or material enhancements. Domain wall positioning can be adjusted through conductor-gradient or spintorque effects. Some examples of this disclosure may use domain wall structures and/or domain configurations to define a plurality of states. Read-back may be performed using the Tunneling Magneto-Resistive (TMR) effect. In some examples, read-back may be performed based on the GMR (Giant Magneto-Resistive) effect, in which the tunnel barrier may be replaced with a non-magnetic metal.

In contrast to some memory devices, including magnetic tunnel junction devices, support two operating modes, one of which is a binary mode for digital information storage, with the other as a sensing mode that responds to an excitation but has only a single stable zero-state. Other devices have been suggested for neuromorphic/memristor applications that are charge based but not magnetic and also not spintronic. By sweeping and/or translating a free layer of a magnetic tunnel junction element with current-driven inductive magnetic fields or a spin-transfer current, a single magnetic tunnel junction element may be set to three or more states, which may permit a resulting memory device to become smaller with better performance compared to magnetic tunnel junction devices supporting two operating modes.

FIG. 1A shows a conceptual illustration of a magnetic tunnel junction element 100 configured to represent a digital bit value. Magnetic tunnel junction element 100 may form part of a larger memory device that includes, for example, tens of billions of magnetic tunnel junction elements or more. Magnetic tunnel junction element 100 may include top contact 102, free layer 104, tunnel barrier 106, pinned layer 108, and bottom contact 110.

Top contact 102 and bottom contact 110 may be formed of a conductive material to permit a connection to read a state of magnetic tunnel junction element 100. Examples of conductive materials may include, but are not limited to, copper.

Free layer 104 may include a magnetization direction that is free to switch between a parallel orientation, as indicated by the double-arrow symbol 112A, and an antiparallel orientation, as indicated by the double-arrow symbol 112B. By applying an appropriate magnetic field to magnetic tunnel junction element 100, the magnetization direction of free layer 104 can be inverted.

Tunnel barrier 106 includes a non-magnetic metal that separates free layer 104 and pinned layer 108. In some examples, tunnel barrier 106 may be formed of copper, aluminum oxide, magnesium oxide, or another material.

Pinned layer 108 may include a magnetization direction that is fixed or "pinned" to a single orientation. For example, pinned layer 108 may be pinned in a parallel orientation, as indicated by the single-arrow symbol 114A. In other examples, pinned layer 108 may be pinned in an antiparallel orientation, as indicated by the single-arrow symbol 114B. In the example of FIG. 1A, pinned layer 108 may include an anti-ferromagnetic layer, such that the magnetization direction of the pinned layer 108 is "pinned" in a particular orientation the magnetization direction of the pinned layer 108 remains relatively fixed when operational magnetic fields are applied to magnetic tunnel junction element 100. In this way, applying an appropriate magnetic field to magnetic tunnel junction element 100, may cause the magnetization direction of free layer 104 to invert while the magnetization direction of pinned layer 108 remains the same.

In the example of FIG. 1A, a magnetization direction of free layer 104 is used to determine whether magnetic tunnel junction element 100 is operating in a first state or a second state. For example, writing circuitry may apply an appropriate magnetic field to magnetic tunnel junction element 100, to cause the magnetization direction of free layer 104 to invert to set magnetic tunnel junction element 100 from a logical '0' to a logical '1'.

Figure 1B:
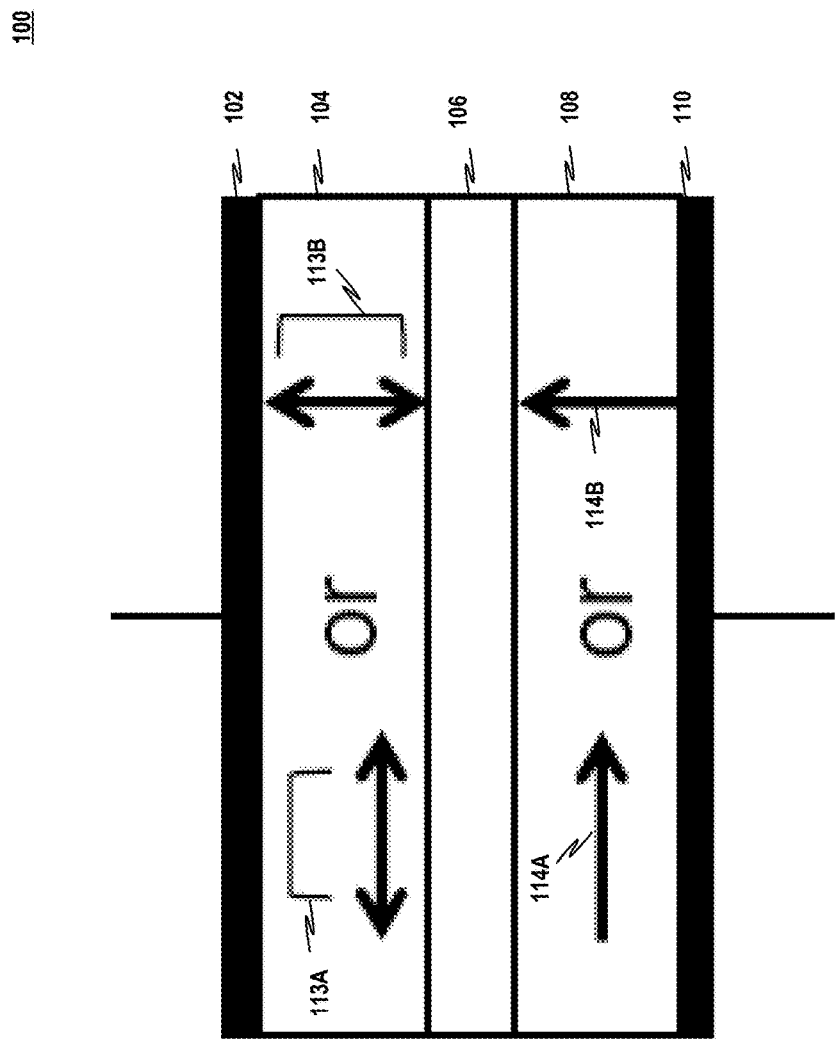
FIG. 1B shows a conceptual illustration of the magnetic tunnel junction element of FIG. 1A that is configured for use as a sensor.

FIG. 1B shows a conceptual illustration of magnetic tunnel junction element 100 of FIG. 1A that is configured for use as a sensor. In the example of FIG. 1B, in addition to using a magnetization direction of free layer 104, a magnitude of the magnetization of free layer 104 is used to detect a direction and magnitude of a magnetic field at magnetic tunnel junction element 100. More specifically, for example, a magnitude of magnetization along parallel orientation, as indicated by the double-arrow symbol 113A, and/or a magnitude of magnetization along an antiparallel orientation, as indicated by the double-arrow symbol 113B may be detected using a resistance and/or magnetoresistance of the magnetic tunnel junction element 100. In this manner, magnetic tunnel junction element 100 may be used as a sensor.

Figure 2A:
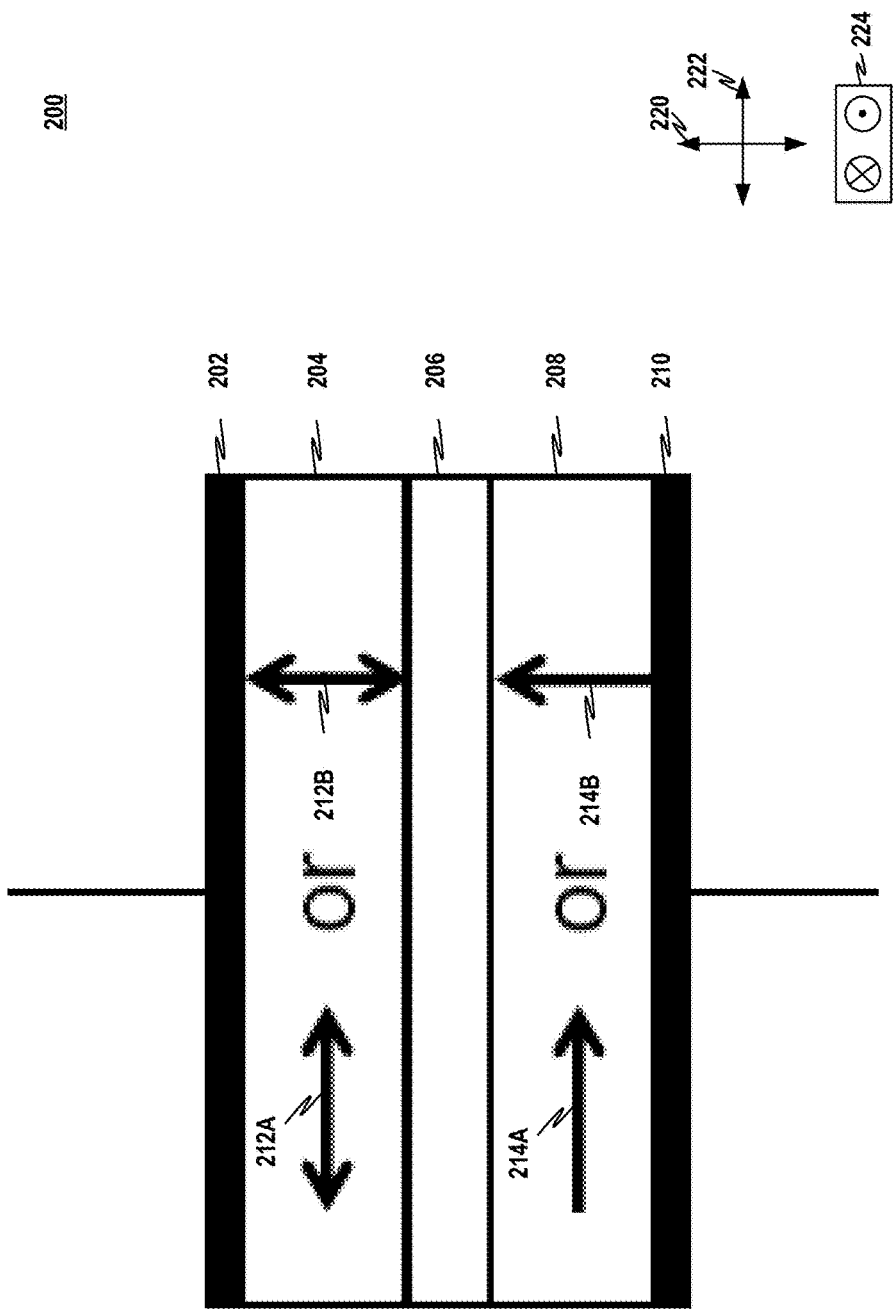
FIG. 2A shows a conceptual illustration of a side view of a first magnetic tunnel junction element according to the current disclosure.

FIG. 2A shows a conceptual illustration of a side view of a first magnetic tunnel junction element 200 according to the current disclosure. Magnetic tunnel junction element 200 may form part of a larger memory device that includes, for example, tens of billions of magnetic tunnel junction elements or more. Magnetic tunnel junction element 200 may include top contact 202, free layer 204, tunnel barrier 206, pinned layer 208, and bottom contact 210. Top contact 202 may be an example of top contact 102 of FIGS. 1A and 1B. Free layer 204 may be an example of free layer 104 of FIGS. 1A and 1B. Tunnel barrier 206 may be an example of tunnel barrier 106 of FIGS. 1A and 1B. Pinned layer 208 may be an example of pinned layer 108 of FIGS. 1A and 1B. For example, pinned layer 208 may be pinned in a parallel orientation, as indicated by the single-arrow symbol 214A or pinned in an antiparallel orientation, as indicated by the single-arrow symbol 214B. Bottom contact 210 may be an example of bottom contact 110 of FIGS. 1A and 1B.

In the example of FIG. 2A, writing circuitry may apply an appropriate magnetic field to magnetic tunnel junction element 200, to cause the magnetization direction of free layer 204 to invert. For example, writing circuitry may apply an appropriate magnetic field to magnetic tunnel junction element 200, to cause the magnetization direction of free layer 204 to invert from parallel orientation, as indicated by the double-arrow symbol 212A, to an antiparallel orientation, as indicated by the double-arrow symbol 212B.

As shown in FIG. 2A, free layer 204 is spaced apart along vertical direction 220 from pinned layer 208 by tunnel barrier 206. Moreover, free layer 204 extends along both a first horizontal direction 222 and a second horizontal direction 224.

Figure 2B:
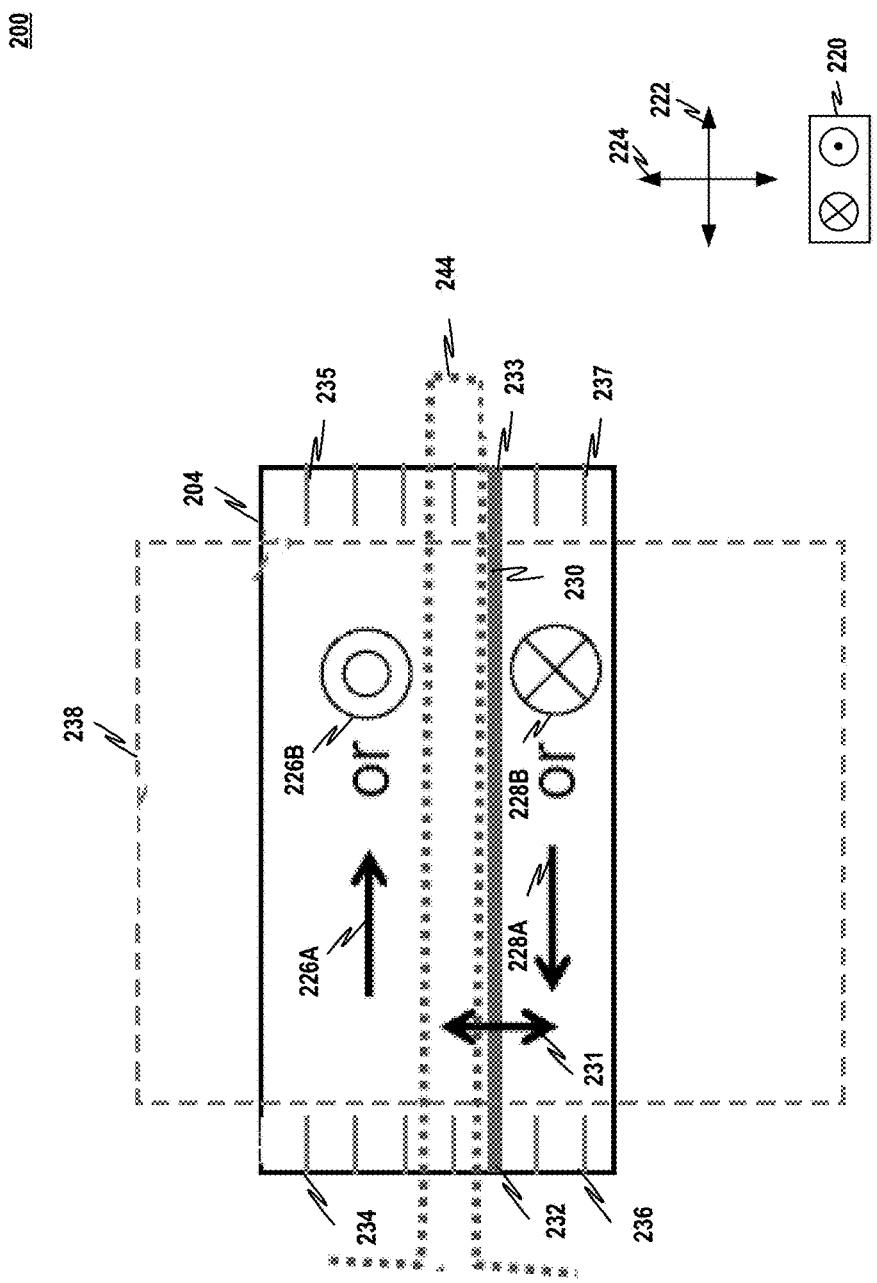
FIG. 2B shows a conceptual illustration of a top view of the first magnetic tunnel junction element of FIG. 2A according to the current disclosure.

FIG. 2B shows a conceptual illustration of a top view of the first magnetic tunnel junction element 200 of FIG. 2A according to the current disclosure. For illustration purposes only, FIG. 2B illustrates a top view of first magnetic tunnel junction element 200 without including top contact 202. It should be understood that first magnetic tunnel junction element 200 may include top contact 202 placed adjacent to free layer 204 as shown in FIG. 2A. Free layer 204 may include domain wall 230, pinning sites 232-237, domain wall nucleator 244, and input current metallization 238.

Domain wall 230 may separate different domains of free layer 204. For example, domain wall 230 may separate a first domain, as indicated by the single-arrow symbol 226A, and a second domain, as indicated by the single-arrow symbol 228A when free layer 204 is in parallel orientation, as indicated by the double-arrow symbol 212A of FIG. 2A. In some examples, domain wall 230 may separate a first domain, as indicated by the single-arrow symbol 226B, and a second domain, as indicated by the single-arrow symbol 228B when free layer 204 is in antiparallel orientation, as indicated by the double-arrow symbol 212B of FIG. 2A.

In some examples, free layer 204 may include pinning sites 232-237. Pinning sites may refer to notches, voids, portions of free layer 204 formed of a different material, or other pinning sites. As shown, domain wall 230 may be arranged on pinning site 232 and pinning site 233. In some examples, domain wall 230 may be arranged on pinning site 234 and pinning site 235. In some examples, domain wall 230 may be arranged on pinning site 236 and pinning site 237. Although the example of FIG. 2B discusses three pairs of pinning sites, more than three pairs of pinning sites may be used. Moreover, although the example of FIG. 2B illustrates uniform spacing between pinning sites, in some examples pinning sites may have non-uniform spacing. For example, pinning site 232 may be spaced apart from a first neighboring pinning site by a distance that is different than a distance separating pinning site 232 from a second neighboring pinning site.

Input current metallization 238 may represent an inductive and/or spin transfer current or charge that sweeps domain wall 230 to change a position of domain wall 230 within free layer 204.

In the example of FIGS. 2A and 2B, writing circuitry may apply an appropriate input current metallization 238 to magnetic tunnel junction element 200, to cause domain wall 230 to sweep along second horizontal direction 224 as indicated by the double-arrow symbol 231. For example, writing circuitry may apply an appropriate magnetic field to magnetic tunnel junction element 200, to cause the magnetization direction of free layer 204 from pinning sites 232 and 233 to pinning sites 234 and 235. In another example, writing circuitry may apply an appropriate magnetic field to magnetic tunnel junction element 200, to cause the magnetization direction of free layer 204 from pinning sites 232 and 233 to pinning sites 236 and 237. In this way, writing circuitry may apply an appropriate magnetic field to magnetic tunnel junction element 200, to cause domain wall 230 of free layer 204 to translate to a first position (e.g., pinning sites 232 and 233) that corresponds to a first state logical '00', a second position (e.g., pinning sites 234 and 235) that corresponds to a second state logical '01', and a third position (e.g., pinning sites 236 and 237) that corresponds to a third state logical '10'.

Figure 7:
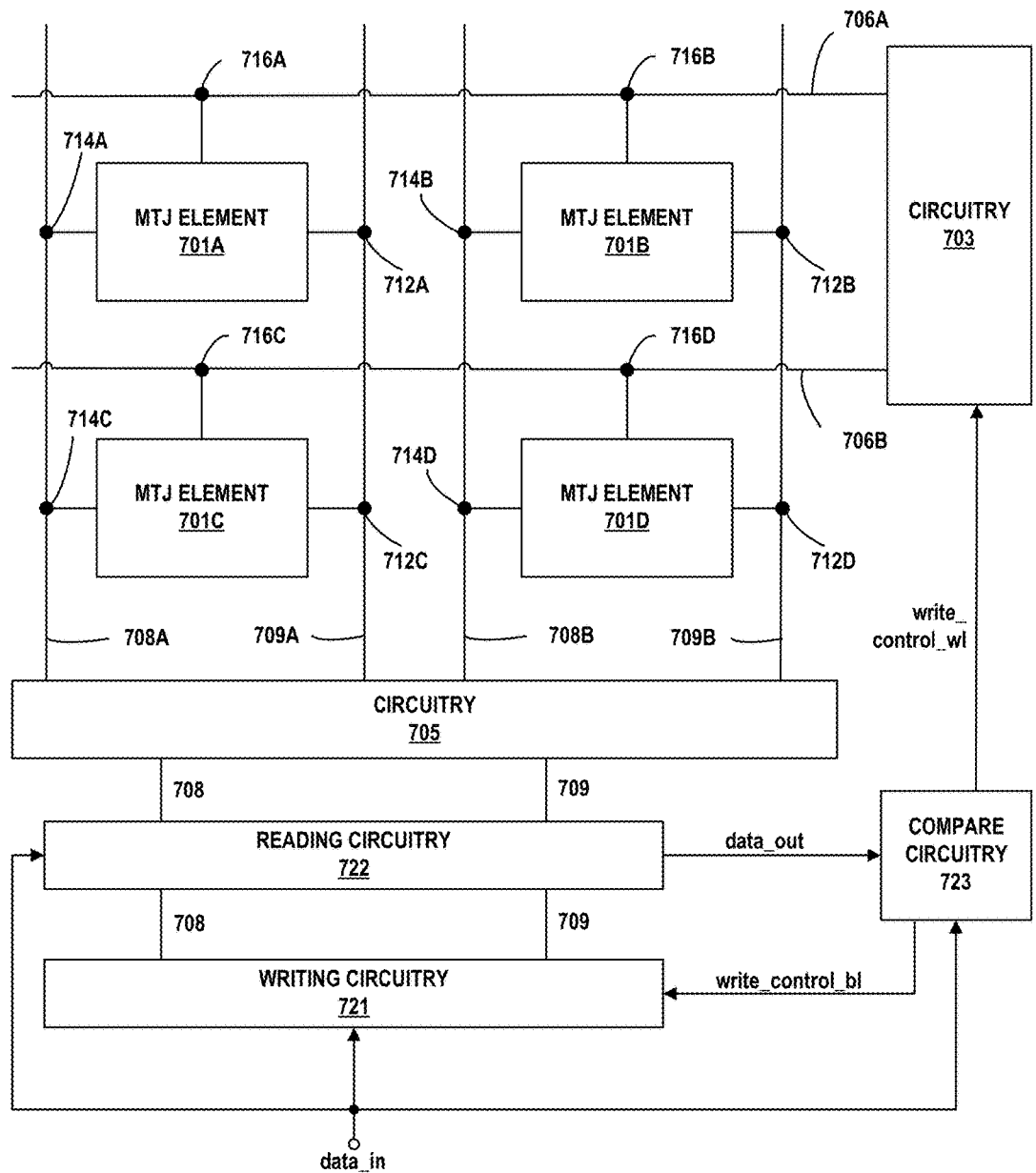
FIG. 7 shows a diagram of an array of magnetic tunnel junction elements that may be used to implement the techniques of the present disclosure.

In accordance with one or more techniques described herein, a magnetic tunnel junction based memory device may include magnetic tunnel junction element 200 and writing circuitry (e.g., writing circuitry 721 of FIG. 7). As shown, magnetic tunnel junction element 200 may include free layer 204, pinned layer 208, and tunnel barrier 206, free layer 204 being spaced apart along vertical direction 220 from pinned layer 208 by tunnel barrier 206. In the example of FIG. 2B, the writing circuitry is configured to receive an instruction to set magnetic tunnel junction element 200 to a target state (e.g., pinning sites 236 and 237) of three of more states (e.g., pinning sites 232 and 233, pinning sites 234 and 235, pinning sites 236 and 237, etc.) of magnetic tunnel junction element 300 and provide electrical current to modify a position of domain wall 230 of free layer 204 along second horizontal direction 224 to correspond to the target state. As shown, vertical direction 220 is perpendicular to first horizontal direction 222 and second horizontal direction 224 and first horizontal direction 222 is perpendicular to second horizontal direction 224.

Figure 3A:
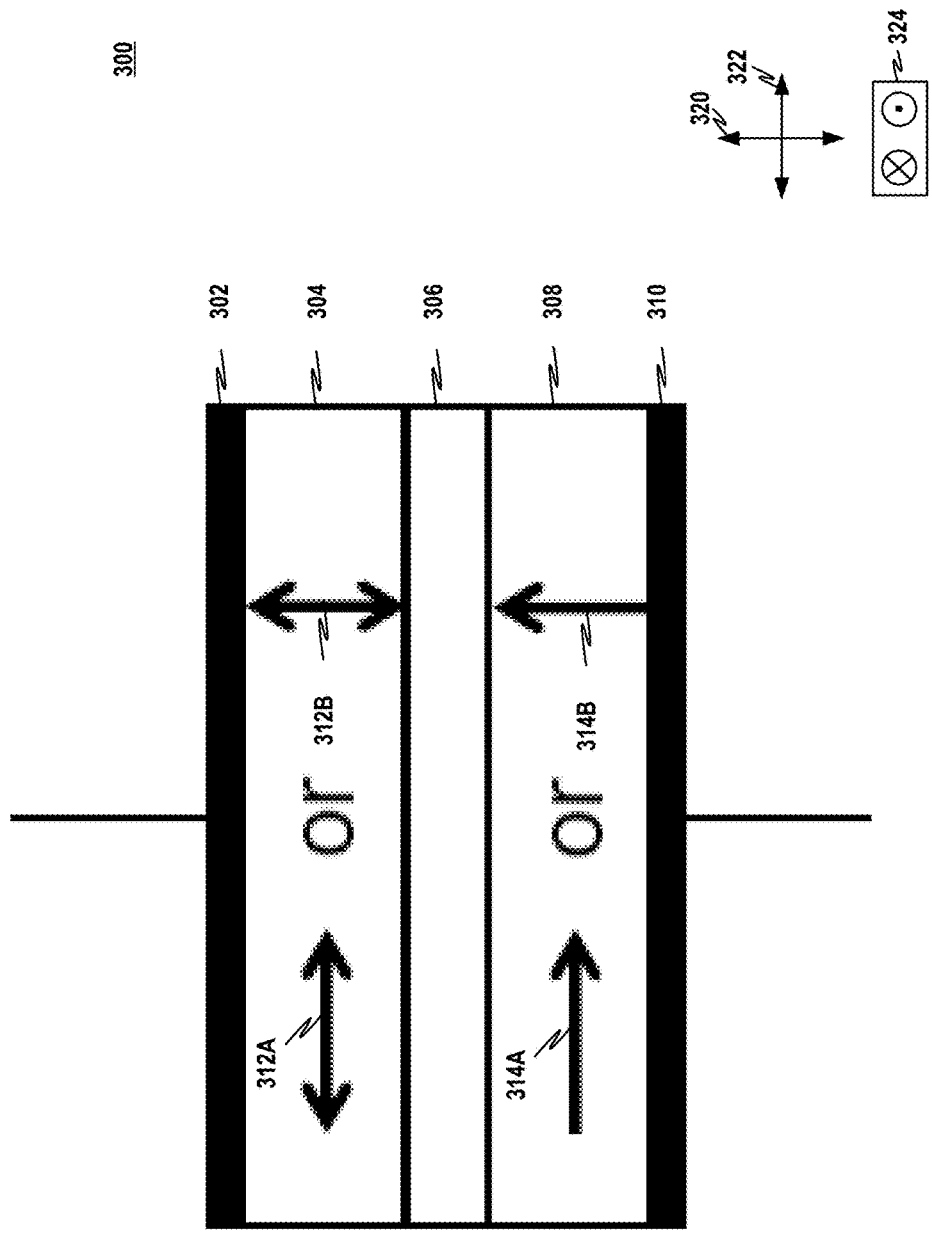
FIG. 3A shows a conceptual illustration of a side view of a second magnetic tunnel junction element according to the current disclosure.

FIG. 3A shows a conceptual illustration of a side view of a second magnetic tunnel junction element according to the current disclosure. Magnetic tunnel junction element 300 may form part of a larger memory device that includes, for example, tens of billions of magnetic tunnel junction elements or more. Magnetic tunnel junction element 300 may include top contact 302, free layer 304, tunnel barrier 306, pinned layer 308, and bottom contact 310. Top contact 302 may be an example of top contact 102 of FIGS. 1A and 1B. Free layer 304 may be an example of free layer 104 of FIGS. 1A and 1B. Tunnel barrier 306 may be an example of tunnel barrier 106 of FIGS. 1A and 1B. Pinned layer 308 may be an example of pinned layer 108 of FIGS. 1A and 1B. For example, pinned layer 308 may be pinned in a parallel orientation, as indicated by the single-arrow symbol 314A or pinned in an antiparallel orientation, as indicated by the single-arrow symbol 314B. Bottom contact 310 may be an example of bottom contact 110 of FIGS. 1A and 1B.

In the example of FIG. 3A, writing circuitry may apply an appropriate magnetic field to magnetic tunnel junction element 300, to cause the magnetization direction of free layer 304 to invert. For example, writing circuitry may apply an appropriate magnetic field to magnetic tunnel junction element 300, to cause the magnetization direction of free layer 304 to invert from parallel orientation, as indicated by the double-arrow symbol 312A, to an antiparallel orientation, as indicated by the double-arrow symbol 312B.

As shown in FIG. 3A, free layer 304 is spaced apart along vertical direction 320 from pinned layer 308 by tunnel barrier 306. Moreover, free layer 304 extends along both a first horizontal direction 322 and a second horizontal direction 324.

Figure 3B:
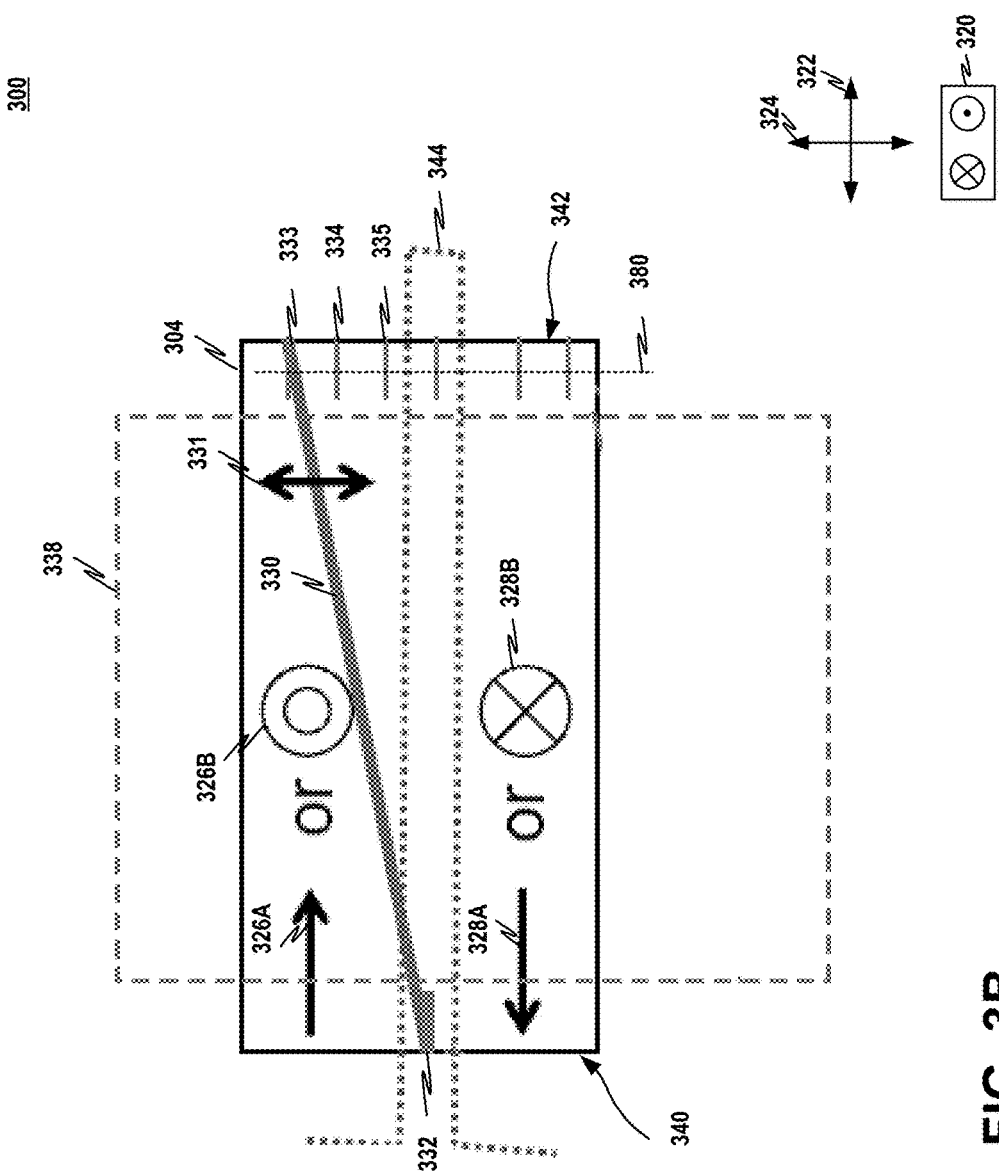
FIG. 3B shows a conceptual illustration of a top view of the second magnetic tunnel junction element of FIG. 3A according to the current disclosure.

FIG. 3B shows a conceptual illustration of a top view of the second magnetic tunnel junction element 300 of FIG. 3A according to the current disclosure. For illustration purposes only, FIG. 3B illustrates a top view of first magnetic tunnel junction element 300 without including top contact 302. It should be understood that first magnetic tunnel junction element 300 may include top contact 302 placed adjacent to free layer 304 as shown in FIG. 3A. Free layer 304 may include domain wall 330, pinning sites 332-335, domain wall nucleator 344, and input current metallization 338.

Domain wall 330 may separate different domains of free layer 304. For example, domain wall 330 may separate a first domain, as indicated by the single-arrow symbol 326A, and a second domain, as indicated by the single-arrow symbol 328A when free layer 304 is in parallel orientation, as indicated by the double-arrow symbol 312A of FIG. 3A. In some examples, domain wall 330 may separate a first domain, as indicated by the single-arrow symbol 326B, and a second domain, as indicated by the single-arrow symbol 328B when free layer 304 is in antiparallel orientation, as indicated by the double-arrow symbol 312B of FIG. 3A.

In some examples, free layer 304 may include pinning sites 332-335. As shown, domain wall 330 may be arranged on pinning site 332 on first side 340 of free layer 304 and one of pinning sites 333-335 on second side 342 of free layer 304.

In the example of FIGS. 3A and 3B, pinning site 332 may represent a relatively strong pinning to hold domain wall 330 at pinning site 332, which may be referred to as a pivot point, compared to pinning sites 333-335 on second side 342. As shown, pinning sites 333-335 may be arranged at common position 380 along first horizontal direction 322. Additionally, or alternatively, each pinning site of pinning sites 333-335 may be spaced apart from other pinning sites of pinning sites 333-335 along second horizontal direction 324. In this way, domain wall 330 may be held at a pivot point by pinning site 332 on first side 340 and a state of magnetic tunnel junction element 300 may change according to a position of domain wall 330 at pinning sites 333-335 on second side 342. Although the example of FIG. 3B discusses three pairs of pinning sites (e.g., pinning site 332 and pinning site 333, pinning site 332 and pinning site 334, etc.), more than three pairs of pinning sites may be used. Moreover, although the example of FIG. 3B illustrates uniform spacing between pinning sites, in some examples pinning sites may have non-uniform spacing. For example, pinning site 334 may be spaced apart from pinning site 333 by a distance that is different than a distance separating pinning site 334 from pinning site 335.

Input current metallization 338 may represent an inductive or spin transfer current or charge that sweeps domain wall 330 to change a position of domain wall 330 within free layer 304 as indicated by the double-arrow symbol 331.

In the example of FIGS. 3A and 3B, writing circuitry may apply an appropriate input current metallization 338 to magnetic tunnel junction element 300, to cause domain wall 330 to sweep along both first horizontal direction 322 and second horizontal direction 324. For example, writing circuitry may apply an appropriate magnetic field to magnetic tunnel junction element 300, to cause the magnetization direction of free layer 304 to move from pinning site 333 to pinning site 334. In another example, writing circuitry may apply an appropriate magnetic field to magnetic tunnel junction element 300, to cause the magnetization direction of free layer 304 to move from pinning sites 332 to pinning sites 334. In this way, writing circuitry may apply an appropriate magnetic field to magnetic tunnel junction element 300, to cause domain wall 330 of free layer 304 to translate to a first position (e.g., pinning sites 332 and 333) that corresponds to a first state logical '00', a second position (e.g., pinning sites 332 and 334) that corresponds to a second state logical '01', and a third position (e.g., pinning sites 332 and 335) that corresponds to a third state logical '10'.

In accordance with one or more techniques described herein, a magnetic tunnel junction based memory device may include magnetic tunnel junction element 300 and writing circuitry (e.g., writing circuitry 721 of FIG. 7). As shown, magnetic tunnel junction element 300 may include free layer 304, pinned layer 308, and tunnel barrier 306, free layer 304 being spaced apart along vertical direction 320 from pinned layer 308 by tunnel barrier 306. In the example of FIG. 3B, writing circuitry is configured to receive an instruction to set magnetic tunnel junction element 300 to a target state (e.g., pinning sites 332 and 334) of three of more states (e.g., pinning sites 332 and 333, pinning sites 332 and 334, pinning sites 332 and 335, etc.) of magnetic tunnel junction element 300 and provide electrical current to modify a position of domain wall 330 of free layer 304 along both first horizontal direction 322 and second horizontal direction 324 to correspond to the target state. As shown, vertical direction 320 is perpendicular to first horizontal direction 322 and second horizontal direction 324 and first horizontal direction 322 is perpendicular to second horizontal direction 324.

In the example of FIGS. 3A and 3B, domain wall 330 may extend along first horizontal direction 322 from first side 340 of free layer 304 to second side 342 of free layer 304 that is opposite to first side 340 of free layer 304. In this example, providing electrical current to modify the position of domain wall 330 includes providing the electrical current to modify the position of domain wall 330 at second side 342 of free layer 304 and along second horizontal direction 324 to a target position relative to the position of domain wall 330 at first side 340 of free layer 304 that corresponds to the target state.

Figure 4A:
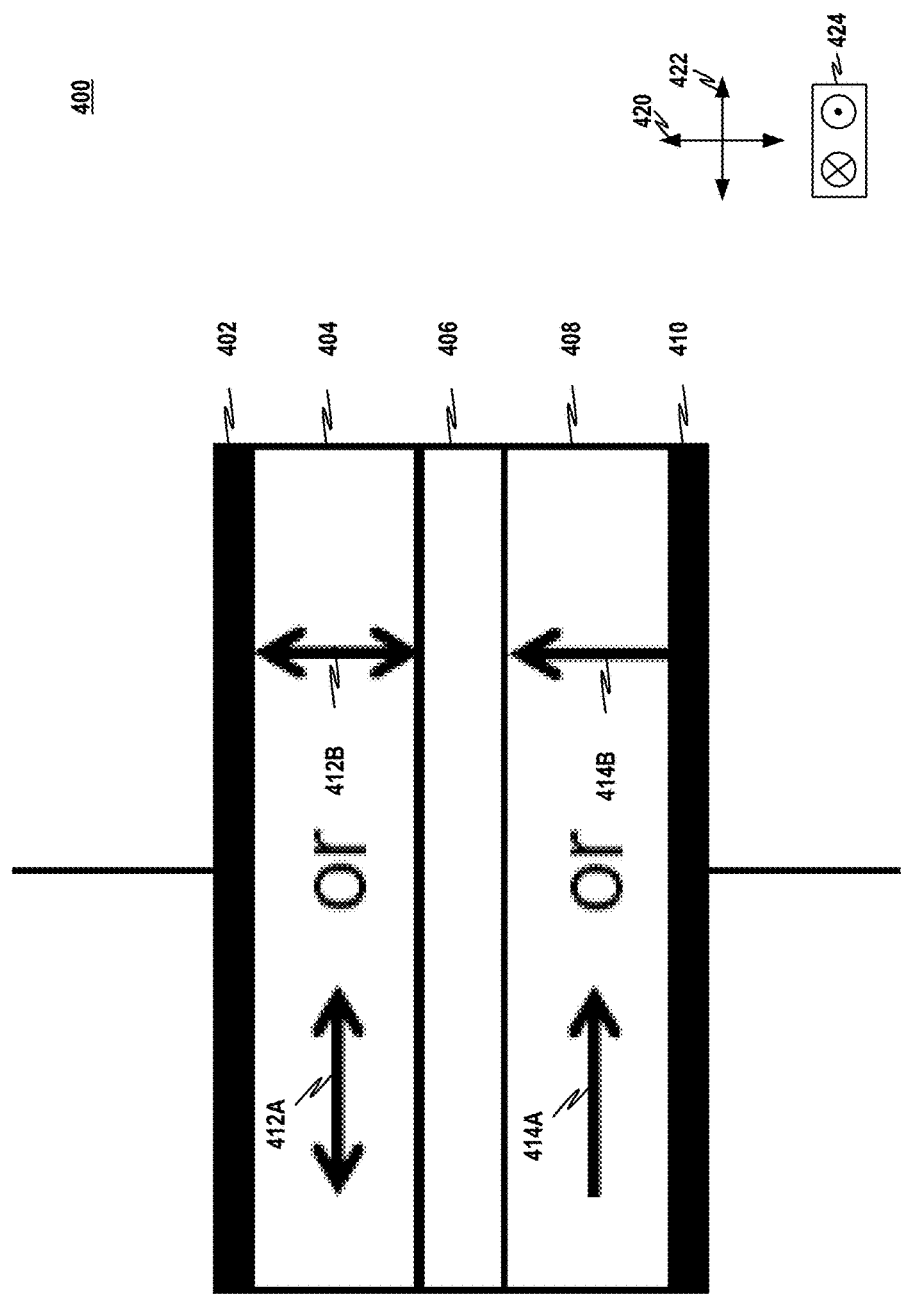
FIG. 4A shows a conceptual illustration of a side view of a third magnetic tunnel junction element according to the current disclosure.

FIG. 4A shows a conceptual illustration of a side view of a third magnetic tunnel junction element 400 according to the current disclosure. Magnetic tunnel junction element 400 may form part of a larger memory device that includes, for example, tens of billions of magnetic tunnel junction elements or more. Magnetic tunnel junction element 400 may include top contact 402, free layer 404, tunnel barrier 406, pinned layer 408, and bottom contact 410. Top contact 402 may be an example of top contact 102 of FIGS. 1A and 1B. Free layer 404 may be an example of free layer 104 of FIGS. 1A and 1B. Tunnel barrier 406 may be an example of tunnel barrier 106 of FIGS. 1A and 1B. Pinned layer 408 may be an example of pinned layer 108 of FIGS. 1A and 1B. For example, pinned layer 408 may be pinned in a parallel orientation, as indicated by the single-arrow symbol 414A or pinned in an antiparallel orientation, as indicated by the single-arrow symbol 414B. Bottom contact 410 may be an example of bottom contact 110 of FIGS. 1A and 1B.

In the example of FIG. 4A, writing circuitry may apply an appropriate magnetic field to magnetic tunnel junction element 400, to cause the magnetization direction of free layer 404 to invert. For example, writing circuitry may apply an appropriate magnetic field to magnetic tunnel junction element 400, to cause the magnetization direction of free layer 404 to invert from parallel orientation, as indicated by the double-arrow symbol 412A, to an antiparallel orientation, as indicated by the double-arrow symbol 412B.

As shown in FIG. 4A, free layer 404 is spaced apart along vertical direction 420 from pinned layer 408 by tunnel barrier 406. Moreover, free layer 404 extends along both a first horizontal direction 422 and a second horizontal direction 424.

Figure 4B:
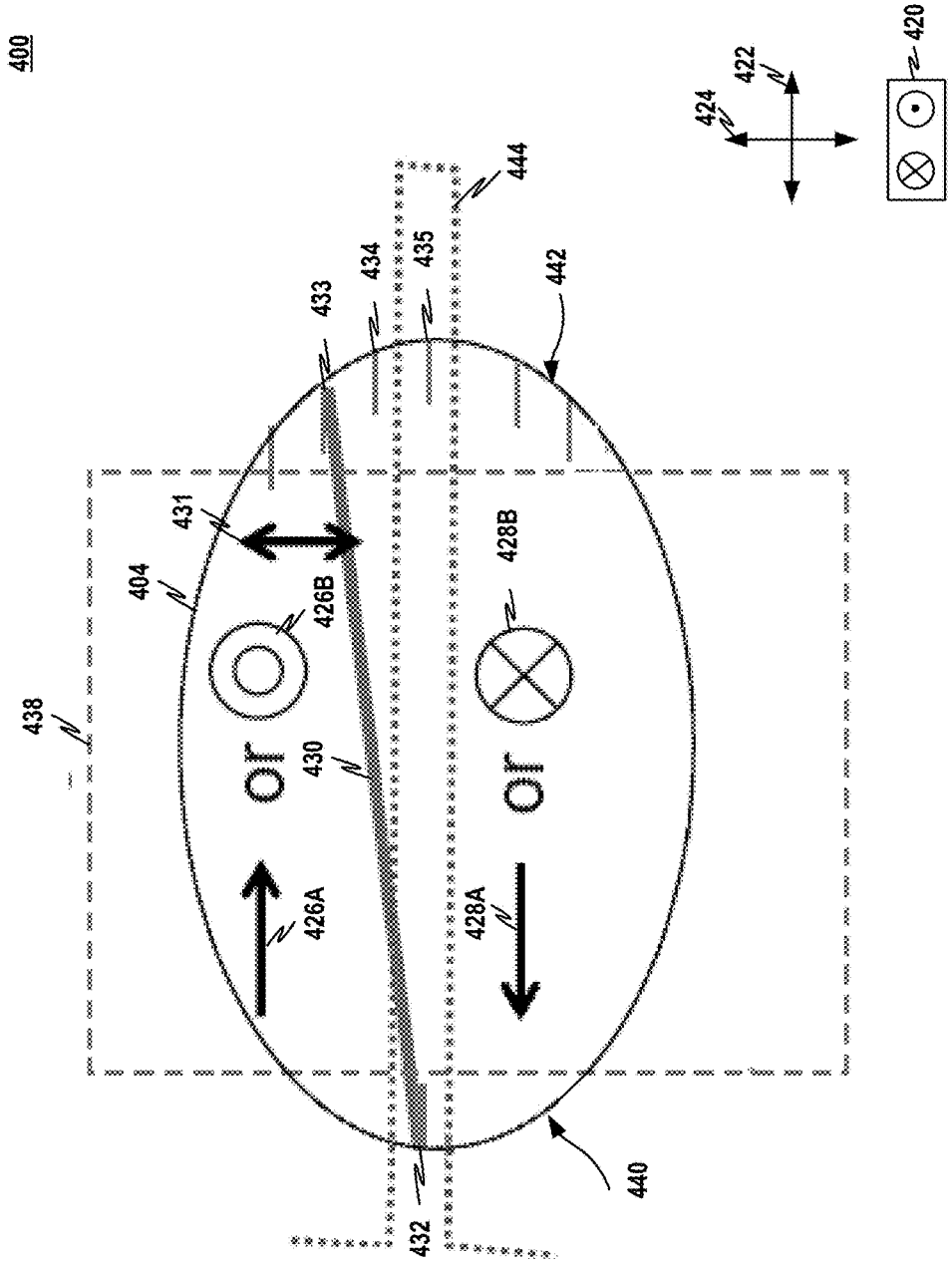
FIG. 4B shows a conceptual illustration of a top view of the third magnetic tunnel junction element of FIG. 4A according to the current disclosure.

FIG. 4B shows a conceptual illustration of a top view of the third magnetic tunnel junction element 400 of FIG. 4A according to the current disclosure. For illustration purposes only, FIG. 4B illustrates a top view of first magnetic tunnel junction element 400 without including top contact 402. It should be understood that first magnetic tunnel junction element 400 may include top contact 402 placed adjacent to free layer 404 as shown in FIG. 4A. Free layer 404 may include domain wall 430, pinning sites 432-435, domain wall nucleator 444, and input current metallization 438.

Domain wall 430 may separate different domains of free layer 404. For example, domain wall 430 may separate a first domain, as indicated by the single-arrow symbol 426A, and a second domain, as indicated by the single-arrow symbol 428A when free layer 404 is in parallel orientation, as indicated by the double-arrow symbol 412A of FIG. 4A. In some examples, domain wall 430 may separate a first domain, as indicated by the single-arrow symbol 426B, and a second domain, as indicated by the single-arrow symbol 428B when free layer 404 is in antiparallel orientation, as indicated by the double-arrow symbol 412B of FIG. 4A.

In some examples, free layer 404 may include pinning sites 432-435. As shown, domain wall 430 may be arranged on pinning site 432 on first side 440 of free layer 404 and one of pinning sites 433-435 on second side 442 of free layer 404. Although the example of FIG. 4B illustrates uniform spacing between pinning sites, in some examples pinning sites may have non-uniform spacing. For example, pinning site 434 may be spaced apart from pinning site 433 by a distance that is different than a distance separating pinning site 434 from pinning site 435.

In the example of FIGS. 4A and 43B, pinning site 432 may represent a relatively strong pinning to hold domain wall 430 at pinning site 432, which may be referred to as a pivot point, compared to pinning sites 433-435 on second side 442. As shown, pinning sites 433-435 may be arranged at different positions along first horizontal direction 422. Additionally, or alternatively, each pinning site of pinning sites 433-435 may be spaced apart from other pinning sites of pinning sites 433-435 along second horizontal direction 424. In this way, domain wall 430 may be held at a pivot point by pinning site 432 on first side 440 and a state of magnetic tunnel junction element 400 may change according to a position of domain wall 430 at pinning sites 433-435 on second side 442.

Input current metallization 438 may represent an inductive or spin transfer current or charge that sweeps domain wall 430 to change a position of domain wall 430 within free layer 404 as indicated by the double-arrow symbol 431.

In the example of FIGS. 4A and 4B, writing circuitry may apply an appropriate input current metallization 438 to magnetic tunnel junction element 400, to cause domain wall 430 to sweep along both first horizontal direction 422 and second horizontal direction 424. For example, writing circuitry may apply an appropriate magnetic field to magnetic tunnel junction element 400, to cause the magnetization direction of free layer 404 to move from pinning site 433 to pinning site 434. In another example, writing circuitry may apply an appropriate magnetic field to magnetic tunnel junction element 400, to cause the magnetization direction of free layer 404 to move from pinning sites 432 to pinning sites 434. In this way, writing circuitry may apply an appropriate magnetic field to magnetic tunnel junction element 400, to cause domain wall 430 of free layer 404 to translate to a first position (e.g., pinning sites 432 and 433) that corresponds to a first state logical '00', a second position (e.g., pinning sites 432 and 434) that corresponds to a second state logical '01', and a third position (e.g., pinning sites 432 and 435) that corresponds to a third state logical '10'.

In accordance with one or more techniques described herein, a magnetic tunnel junction based memory device may include magnetic tunnel junction element 400 and writing circuitry (e.g., writing circuitry 721 of FIG. 7). As shown, magnetic tunnel junction element 400 may include free layer 404, pinned layer 408, and tunnel barrier 406, free layer 404 being spaced apart along vertical direction 420 from pinned layer 408 by tunnel barrier 406. In the example of FIG. 4B, writing circuitry is configured to receive an instruction to set magnetic tunnel junction element 400 to a target state (e.g., pinning sites 432 and 434) of three of more states (e.g., pinning sites 432 and 433, pinning sites 432 and 434, pinning sites 432 and 435, etc.) of magnetic tunnel junction element 400 and provide electrical current to modify a position of domain wall 430 of free layer 404 along both first horizontal direction 422 and second horizontal direction 424 to correspond to the target state. As shown, vertical direction 420 is perpendicular to first horizontal direction 422 and second horizontal direction 424 and first horizontal direction 422 is perpendicular to second horizontal direction 424.

In the example of FIGS. 4A and 4B, domain wall 430 may extend along first horizontal direction 422 from first side 440 of free layer 404 to second side 442 of free layer 404 that is opposite to first side 440 of free layer 404. In this example, providing electrical current to modify the position of domain wall 430 includes providing the electrical current to modify the position of domain wall 430 at second side 442 of free layer 404 and along second horizontal direction 424 to a target position relative to the position of domain wall 430 at first side 440 of free layer 404 that corresponds to the target state.

FIG. 5A shows a conceptual illustration of a side view of a fourth magnetic tunnel junction element 500 according to the current disclosure. Magnetic tunnel junction element 500 may form part of a larger memory device that includes, for example, tens of billions of magnetic tunnel junction elements or more. Magnetic tunnel junction element 500 may include top contact 502, free layer 504, tunnel barrier 506, pinned layer 508, and bottom contact 510. Top contact 502 may be an example of top contact 102 of FIGS. 1A and 1B. Free layer 504 may be an example of free layer 104 of FIGS. 1A and 1B. Tunnel barrier 506 may be an example of tunnel barrier 106 of FIGS. 1A and 1B. Pinned layer 508 may be an example of pinned layer 108 of FIGS. 1A and 1B. For example, pinned layer 508 may be pinned in a parallel orientation, as indicated by the single-arrow symbol 514A or pinned in an antiparallel orientation, as indicated by the single-arrow symbol 514B. Bottom contact 510 may be an example of bottom contact 110 of FIGS. 1A and 1B.

In the example of FIG. 5A, writing circuitry may apply an appropriate magnetic field to magnetic tunnel junction element 500, to cause the magnetization direction of free layer 504 to invert. For example, writing circuitry may apply an appropriate magnetic field to magnetic tunnel junction element 500, to cause the magnetization direction of free layer 504 to invert from parallel orientation, as indicated by the double-arrow symbol 512A, to an antiparallel orientation, as indicated by the double-arrow symbol 512B.

As shown in FIG. 5A, free layer 504 is spaced apart along vertical direction 520 from pinned layer 508 by tunnel barrier 506. Moreover, free layer 504 extends along both a first horizontal direction 522 and a second horizontal direction 524.

Figure 5B:
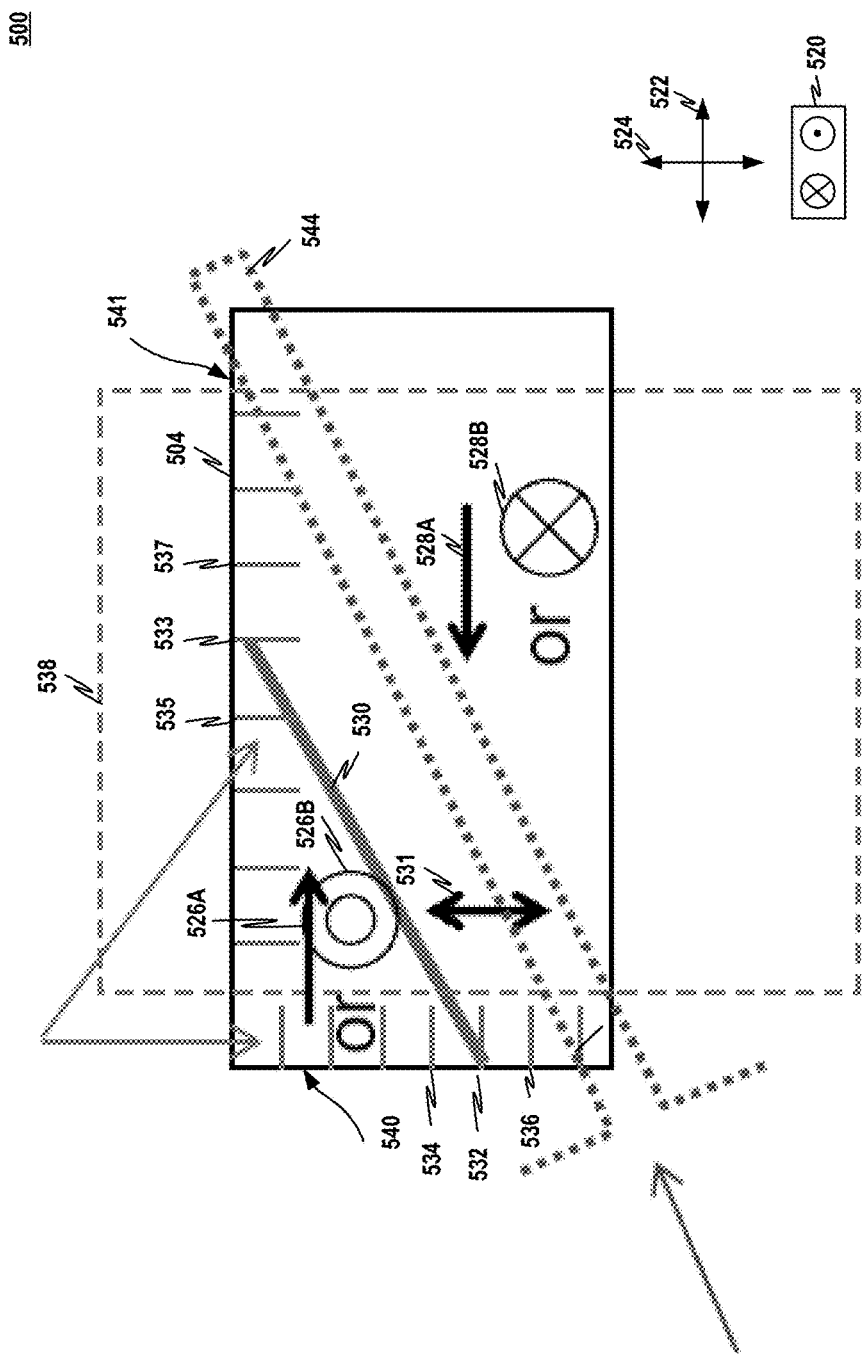
FIG. 5B shows a conceptual illustration of a top view of the fourth magnetic tunnel junction element of FIG. 5A according to the current disclosure.

FIG. 5B shows a conceptual illustration of a top view of the fourth magnetic tunnel junction element 500 of FIG. 5A according to the current disclosure. For illustration purposes only, FIG. 5B illustrates a top view of first magnetic tunnel junction element 500 without including top contact 502. It should be understood that first magnetic tunnel junction element 500 may include top contact 502 placed adjacent to free layer 504 as shown in FIG. 5A. Free layer 504 may include domain wall 530, pinning sites 532-537, domain wall nucleator 544, and input current metallization 538.

Domain wall 530 may separate different domains of free layer 504. For example, domain wall 530 may separate a first domain, as indicated by the single-arrow symbol 526A, and a second domain, as indicated by the single-arrow symbol 528A when free layer 504 is in parallel orientation, as indicated by the double-arrow symbol 512A of FIG. 5A. In some examples, domain wall 530 may separate a first domain, as indicated by the single-arrow symbol 526B, and a second domain, as indicated by the single-arrow symbol 528B when free layer 504 is in antiparallel orientation, as indicated by the double-arrow symbol 512B of FIG. 5A.

In some examples, free layer 504 may include pinning sites 532-537. As shown, domain wall 530 may be arranged on one of pinning sites 532, 534, and 536 on side 540 of free layer 504 and one of pinning sites 533, 535, and 537 on top 541 of free layer 504. Although the example of FIG. 5B illustrates uniform spacing between pinning sites, in some examples pinning sites may have non-uniform spacing. For example, pinning site 533 may be spaced apart from pinning site 535 by a distance that is different than a distance separating pinning site 533 from pinning site 537. Additionally, or alternatively, pinning site 532 may be spaced apart from pinning site 534 by a distance that is different than a distance separating pinning site 532 from pinning site 536.

Input current metallization 538 may represent an inductive or spin transfer current or charge that sweeps domain wall 530 to change a position of domain wall 530 within free layer 504 as indicated by the double-arrow symbol 531.

In the example of FIGS. 5A and 5B, writing circuitry may apply an appropriate input current metallization 538 to magnetic tunnel junction element 500, to cause domain wall 530 to sweep along both first horizontal direction 522 and second horizontal direction 524. For example, writing circuitry may apply an appropriate magnetic field to magnetic tunnel junction element 500, to cause the magnetization direction of free layer 504 to move from pinning sites 532 and 533 to pinning sites 534 and 535. In another example, writing circuitry may apply an appropriate magnetic field to magnetic tunnel junction element 500, to cause the magnetization direction of free layer 504 to move from pinning sites 532 and 533 to pinning sites 536 and 537. In this way, writing circuitry may apply an appropriate magnetic field to magnetic tunnel junction element 500, to cause domain wall 530 of free layer 504 to translate to a first position (e.g., pinning sites 532 and 533) that corresponds to a first state logical '00', a second position (e.g., pinning sites 534 and 535) that corresponds to a second state logical '01', and a third position (e.g., pinning sites 536 and 537) that corresponds to a third state logical '10'.

In accordance with one or more techniques described herein, a magnetic tunnel junction based memory device may include magnetic tunnel junction element 500 and writing circuitry (e.g., writing circuitry 721 of FIG. 7). As shown, magnetic tunnel junction element 500 may include free layer 504, pinned layer 508, and tunnel barrier 506, free layer 504 being spaced apart along vertical direction 520 from pinned layer 508 by tunnel barrier 506. In the example of FIG. 5B, writing circuitry is configured to receive an instruction to set magnetic tunnel junction element 500 to a target state (e.g., pinning sites 532 and 533) of three of more states (e.g., pinning sites 532 and 533, pinning sites 534 and 535, pinning sites 536 and 537, etc.) of magnetic tunnel junction element 500 and provide electrical current to modify a position of domain wall 530 of free layer 504 along both first horizontal direction 522 and second horizontal direction 524 to correspond to the target state. As shown, vertical direction 520 is perpendicular to first horizontal direction 522 and second horizontal direction 524 and first horizontal direction 522 is perpendicular to second horizontal direction 524.

In the example of FIGS. 5A and 5B, domain wall 530 may extend along both first horizontal direction 522 and second horizontal direction 524 from side 540 of free layer 504 to top 541 of free layer 504 that is perpendicular to side 540 of free layer 504. In this example, providing electrical current to modify the position of domain wall 530 includes providing the electrical current to modify the position of domain wall 530 at top 541 of free layer 504 and along side 540 of free layer 504 that corresponds to the target state.

Figure 6A:
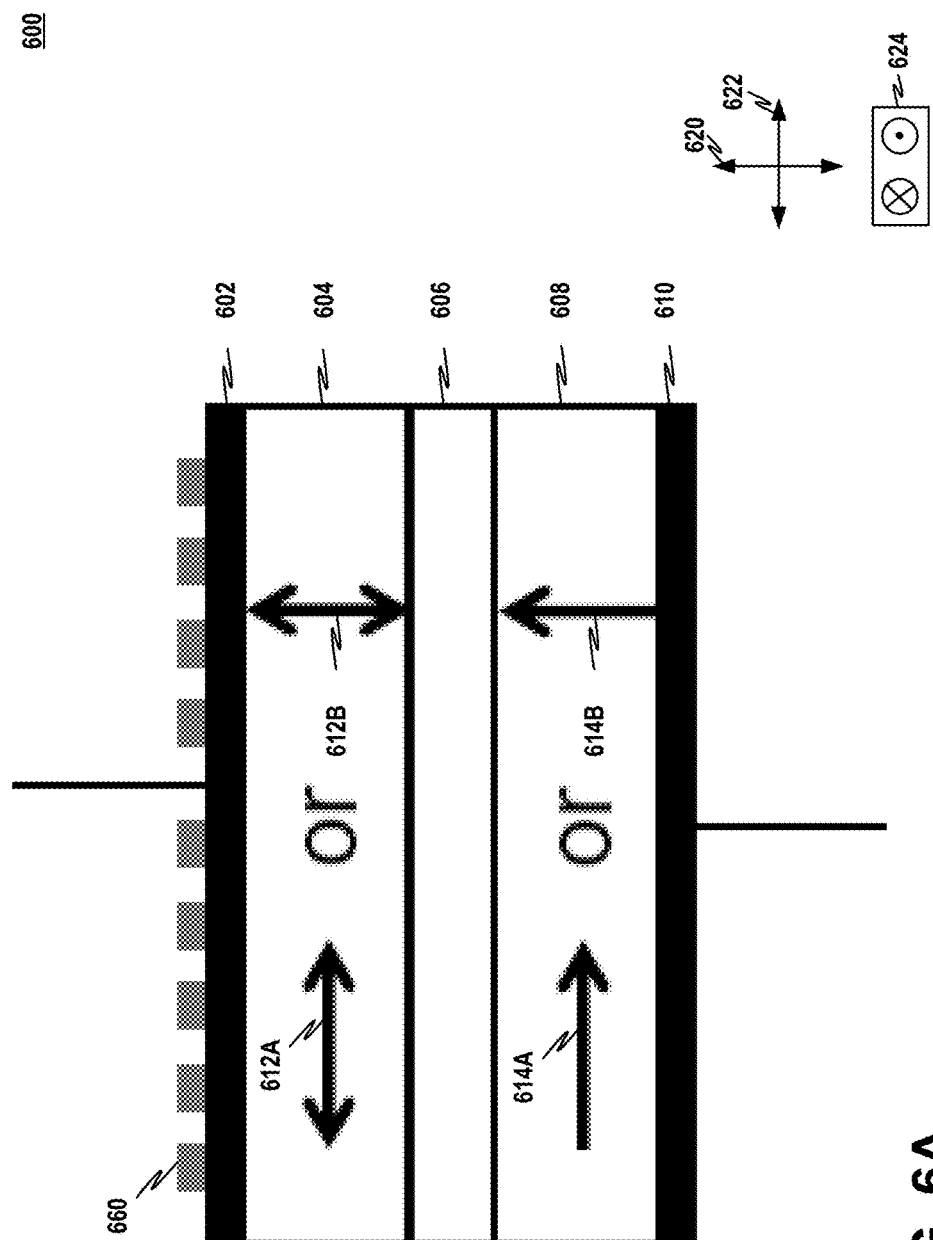
FIG. 6A shows a conceptual illustration of a side view of a fifth magnetic tunnel junction element according to the current disclosure.

FIG. 6A shows a conceptual illustration of a side view of a fifth magnetic tunnel junction element 600 according to the current disclosure. Magnetic tunnel junction element 600 may form part of a larger memory device that includes, for example, tens of billions of magnetic tunnel junction elements or more. Magnetic tunnel junction element 600 may include top contact 602, free layer 604, tunnel barrier 606, pinned layer 608, and bottom contact 610. Top contact 602 may be an example of top contact 102 of FIGS. 1A and 1B. Free layer 604 may be an example of free layer 104 of FIGS. 1A and 1B. Tunnel barrier 606 may be an example of tunnel barrier 106 of FIGS. 1A and 1B. Pinned layer 608 may be an example of pinned layer 108 of FIGS. 1A and 1B. For example, pinned layer 608 may be pinned in a parallel orientation, as indicated by the single-arrow symbol 614A or pinned in an antiparallel orientation, as indicated by the single-arrow symbol 614B. Bottom contact 610 may be an example of bottom contact 110 of FIGS. 1A and 1B.

In the example of FIG. 6A, writing circuitry may apply an appropriate magnetic field to magnetic tunnel junction element 600, to cause the magnetization direction of free layer 604 to invert. For example, writing circuitry may apply an appropriate magnetic field to magnetic tunnel junction element 600, to cause the magnetization direction of free layer 604 to invert from parallel orientation, as indicated by the double-arrow symbol 612A, to an antiparallel orientation, as indicated by the double-arrow symbol 612B.

As shown in FIG. 6A, free layer 604 is spaced apart along vertical direction 620 from pinned layer 608 by tunnel barrier 606. Moreover, free layer 604 extends along both a first horizontal direction 622 and a second horizontal direction 624.

In the example of FIG. 6A, magnetic tunnel junction element 600 includes stabilization components 660. Stabilization components 660 may modify stabilization. In some examples, stabilization components 660 may include strips or bars that span magnetic tunnel junction element 600. In some examples, stabilization components 660 may use magneto-striction. In some examples, stabilization components 660 may use magneto-elasticity, for switching, stability, stabilization, read signal, manufacturability, and/or other purposes.

As shown, stabilization components 660 may extend along second horizontal direction 624. In some examples, stabilization components 660 may extend only along first horizontal direction 622. In some examples, stabilization components 660 may extend only along both first horizontal direction 622 and second horizontal direction 624. For instance, stabilization components 660 may extend along an angle extending between first horizontal direction 622 and second horizontal direction 624.

As shown, stabilization components 660 may extend above free layer 604. For instance, stabilization components 660 may be above free layer 604 and spaced apart from free layer 604 by an intermediate material (e.g., top contact 602). In some instances, stabilization components 660 may be adjacent to free layer 604. In some examples, stabilization components 660 may extend below free layer 604. For instance, stabilization components 660 may be below free layer 604 and spaced apart from free layer 604 by an intermediate material.

Figure 6B:
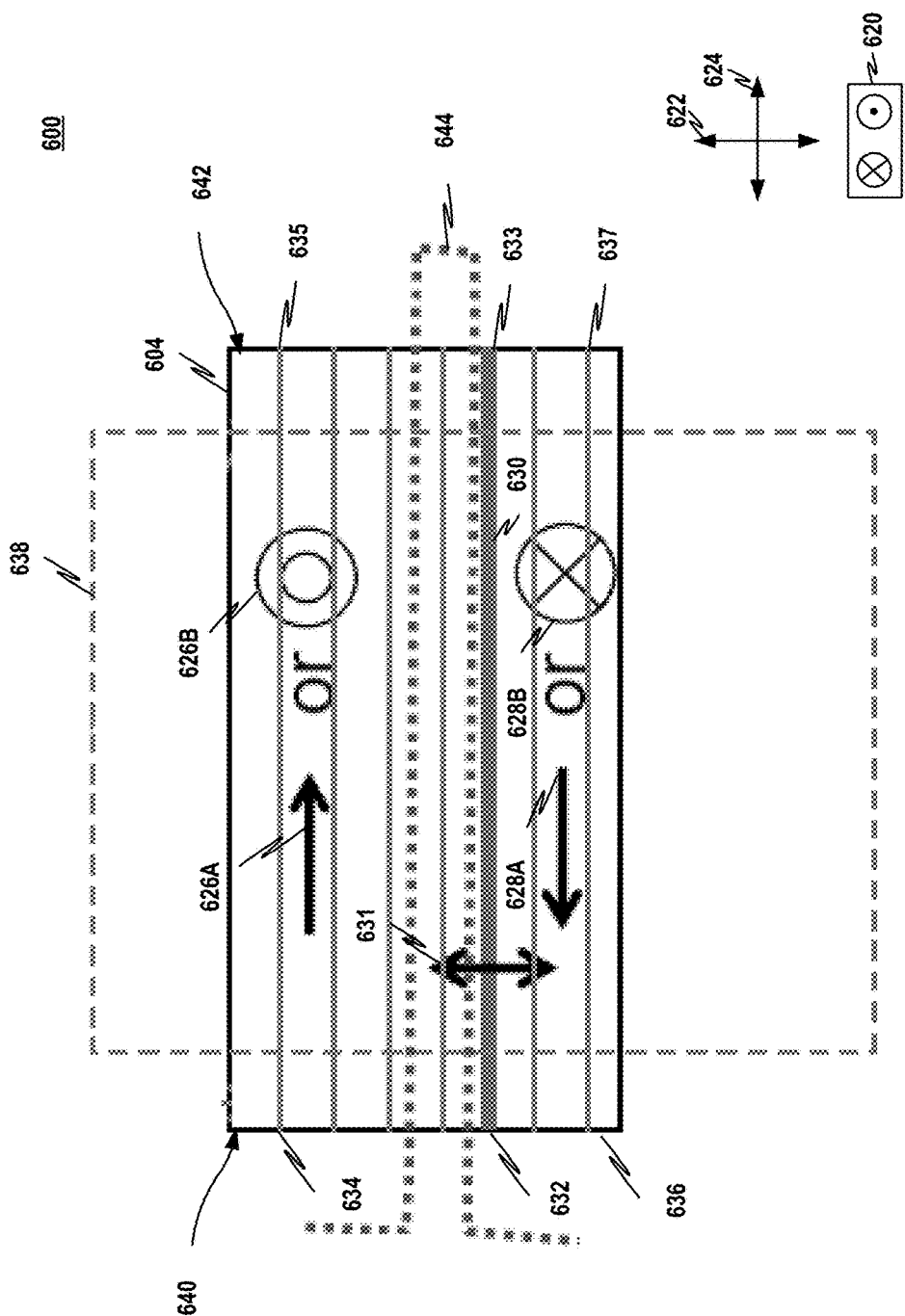
FIG. 6B shows a conceptual illustration of a top view of the fifth magnetic tunnel junction element of FIG. 6A according to the current disclosure.

FIG. 6B shows a conceptual illustration of a top view of the fifth magnetic tunnel junction element 600 of FIG. 6A according to the current disclosure. For illustration purposes only, FIG. 6B illustrates a top view of first magnetic tunnel junction element 600 without including top contact 602. It should be understood that first magnetic tunnel junction element 600 may include top contact 602 placed adjacent to free layer 604 as shown in FIG. 6A. Free layer 604 may include domain wall 630, pinning sites 632-637, domain wall nucleator 644, and input current metallization 638.

Domain wall 630 may separate different domains of free layer 604. For example, domain wall 630 may separate a first domain, as indicated by the single-arrow symbol 626A, and a second domain, as indicated by the single-arrow symbol 628A when free layer 604 is in parallel orientation, as indicated by the double-arrow symbol 612A of FIG. 6A. In some examples, domain wall 630 may separate a first domain, as indicated by the single-arrow symbol 626B, and a second domain, as indicated by the single-arrow symbol 628B when free layer 604 is in antiparallel orientation, as indicated by the double-arrow symbol 612B of FIG. 6A. As shown, domain wall 630 may be arranged on one of pinning sites 632, 634, and 636 on first side 640 of free layer 604 and one of pinning sites 633, 635, and 637 on second side 642 of free layer 604. Although the example of FIG. 6B discusses three pairs of pinning sites, more than three pairs of pinning sites may be used. Moreover, although the example of FIG. 6B illustrates uniform spacing between pinning sites, in some examples pinning sites may have non-uniform spacing. For example, pinning site 632 may be spaced apart from a first neighboring pinning site by a distance that is different than a distance separating pinning site 632 from a second neighboring pinning site.

Input current metallization 638 may represent an inductive or spin transfer current or charge that sweeps domain wall 630 to change a position of domain wall 630 within free layer 604 as indicated by the double-arrow symbol 631.

In the example of FIGS. 6A and 6B, writing circuitry may apply an appropriate input current metallization 638 to magnetic tunnel junction element 600, to cause domain wall 630 to sweep along first horizontal direction 622. For example, writing circuitry may apply an appropriate magnetic field to magnetic tunnel junction element 600, to cause the magnetization direction of free layer 604 to move from pinning sites 632 and 633 to pinning sites 634 and 635. In another example, writing circuitry may apply an appropriate magnetic field to magnetic tunnel junction element 600, to cause the magnetization direction of free layer 604 to move from pinning sites 632 and 633 to pinning sites 636 and 637. In this way, writing circuitry may apply an appropriate magnetic field to magnetic tunnel junction element 600, to cause domain wall 630 of free layer 604 to translate to a first position (e.g., pinning sites 632 and 633) that corresponds to a first state logical '00', a second position (e.g., pinning sites 634 and 635) that corresponds to a second state logical '01', and a third position (e.g., pinning sites 636 and 637) that corresponds to a third state logical '10'.

In accordance with one or more techniques described herein, a magnetic tunnel junction based memory device may include magnetic tunnel junction element 600 and writing circuitry (e.g., writing circuitry 721 of FIG. 7). As shown, magnetic tunnel junction element 600 may include free layer 604, pinned layer 608, and tunnel barrier 606, free layer 604 being spaced apart along vertical direction 620 from pinned layer 608 by tunnel barrier 606. In the example of FIG. 6B, the writing circuitry is configured to receive an instruction to set magnetic tunnel junction element 600 to a target state (e.g., pinning sites 636 and 637) of three of more states (e.g., pinning sites 632 and 633, pinning sites 634 and 635, pinning sites 636 and 637, etc.) of magnetic tunnel junction element 600 and provide electrical current to modify a position of domain wall 630 of free layer 604 along first horizontal direction 622 to correspond to the target state. As shown, vertical direction 620 is perpendicular to first horizontal direction 622 and second horizontal direction 624 and first horizontal direction 622 is perpendicular to second horizontal direction 624.

FIG. 7 shows a diagram of an array of magnetic tunnel junction elements that may be used to implement the techniques of the present disclosure. Memory devices implementing one or more of the techniques described in this disclosure may be implemented in a wide array of electronic devices ranging from small portable devices such as music players, smart phones, game cartridges, and memory sticks up to larger devices such as tablet computers, gaming devices or consoles, desktop computers, super computers, and enterprise storage solutions.

Bitline 708A connects to magnetic tunnel junction element 701A ("MTJ element") at node 714A and connects to magnetic tunnel junction element 701C at node 714C. Bitline 708B connects to magnetic tunnel junction element 701B at node 714B and connects to magnetic tunnel junction element 701D at node 714D. Although, not explicitly shown in FIG. 7, each of nodes 714A-714D may correspond to a source or drain terminal of an access MOSFET for input current metallization 238 of FIG. 2B, input current metallization 338 of FIG. 3B, input current metallization 438 of FIG. 4B, input current metallization 538 of FIG. 5B, and/or input current metallization 638 of FIG. 6B.

Bitline 709A connects to magnetic tunnel junction element 701A at node 712A and connects to magnetic tunnel junction element 701C at node 712C. Bitline 709B connects to magnetic tunnel junction element 701B at node 712B and connects to magnetic tunnel junction element 701D at node 712D. Although, not explicitly shown in FIG. 7, each of nodes 712A-D may correspond to a source or drain terminal of an access MOSFET for input current metallization 238 of FIG. 2B, input current metallization 338 of FIG. 3B, input current metallization 438 of FIG. 4B, input current metallization 538 of FIG. 5B, and/or input current metallization 638 of FIG. 6B.

By controlling the voltages applied to wordline 706A, wordline 706B, bitline 708A, bitline 708B, bitline 709A, and bitline 709B, an individual magnetic tunnel junction element can be addressed. For example, suppose that a write operation is being performed on magnetic tunnel junction element 701A. Circuitry 703 may apply an access MOSFET turn-on voltage to wordline 706A and a turn-off voltage to wordline 706B, and circuitry 705 may pass a high voltage to bitline 709A but not to bitline 709B. In this case, the turn-on voltage applied to wordline 706A causes node 716A (connected to a gate of an access MOSFET, not shown in FIG. 7) to receive a turn-on voltage. The high voltage applied to bitline 709A causes node 712A (connected to a source or drain of an access MOSFET, not shown in FIG. 7) to receive a high voltage, and the source voltage applied to bitline 708A causes node 714A (connected to a source or drain of an access MOSFET) to receive a source voltage. As described above, the high voltage applied to node 716A causes current to flow through an access MOSFET, resulting in input current metallization across magnetic tunnel junction element 701A. Thus, the resistance and/or magnetoresistance of the magnetic tunnel junction element 701A can be changed. Examples of resistance and/or magnetoresistance may include, but are not limited to, tunnel magnetoresistance (TRM), giant magnetoresistance (GMR), anisotropic magnetoresistive (ARM), and other resistance and/or magnetoresistance.

While this write operation is occurring at magnetic tunnel junction element 701A, it is intended that magnetic tunnel junction elements 701B, 701C, and 701D remain unchanged. Although the high voltage applied to wordline 706A can cause a high voltage at node 716B (connected to a gate of an access MOSFET for magnetic tunnel junction element 701B), circuitry 705 may not apply a high voltage to either bitline 708B or bitline 709B. In this case, with no high voltage drop across an access MOSFET for magnetic tunnel junction element 701B, the state of magnetic tunnel junction element 701B does not change.

Similarly, while this write operation is occurring at magnetic tunnel junction element 701A, the high voltage applied to bitline 709A causes a high voltage at node 712C, and the source voltage applied to bitline 708A causes a source voltage at node 714C. Circuitry 703, however, applies a turn-off voltage to wordline 706B. Thus, the access MOSFET of magnetic tunnel junction element 701C does not conduct current, and thus it is intended that this prevents input current metallization across magnetic tunnel junction element 701C. Without a current flow, the resistance of magnetic tunnel junction element 701C does not change, and the state of magnetic tunnel junction element 701C does not change. Accordingly, by controlling the voltages applied to wordline 706A, wordline 706B, bitline 708A, bitline 708B, bitline 709A, and bitline 709B, in the manner described above, magnetic tunnel junction elements 701A, 701B, 701C, and 701D can be individually written to without altering the state of magnetic tunnel junction elements that are connected to a common wordline or common bitline.

Writing circuitry 721 receives data input (e.g., '00', '01', '10'. '11', etc.), which represents a state of three of more states. Depending on the data state to be written, writing circuitry 721 defines the appropriate voltage to be applied to the bitlines. As discussed above, circuitry 705 controls the passing of the voltages from writing circuitry 721 output bitline 708 and bitline 709 to the various bitlines so that the write operation is applied to the correct magnetic tunnel junction element within the array of magnetic tunnel junction elements.

Reading circuitry 722 is configured to monitor the resistance and/or magnetoresistance of a given magnetic tunnel junction element, which may correspond to a position of a domain wall of the given magnetic tunnel junction element, while the given magnetic tunnel junction element is undergoing a write operation. This monitoring of the resistance and/or magnetoresistance is termed Rmonitor, which represents the real time measuring of the magnetic tunnel junction element resistance and/or magnetoresistance during the write operation. It uses the write "00", "01", or "10" states defined on data_in to determine which monitoring state and Rwrite_ref to set up.

Compare circuitry 723 compares the "00", "01" or "10" data state of the selected magnetic tunnel junction element of magnetic tunnel junction elements 701A-701D, as determined by reading circuitry 722 and defined on node data_out, to the "00", "01" or "10" data state as defined on node data_in and issues a write terminate instruction on the write_control_bl and write_control_wl lines upon determining that the data states on data_in and data_out match.

When circuitry 723 issues a write terminate command on write_control_bl to writing circuitry 721, writing circuitry 721 terminates the application of the high voltage on bitline 708 or bitline 709 which causes the high voltage across the selected magnetic tunnel junction element to collapse and, thus, stop the resistance and/or magnetoresistance changing and stop modifying a position of a domain wall in the magnetic tunnel junction element. When circuitry 723 issues a write terminate command on write_control_wl to circuitry 703, circuitry 703 changes the turned-on wordline to turned-off which causes the input current metallization through the selected magnetic tunnel junction element to collapse and, thus, stop the resistance and/or magnetoresistance changing in the magnetic tunnel junction element.

In accordance with one or more techniques described herein, writing circuitry 721 is configured to receive an instruction (e.g., data_in) to set magnetic tunnel junction element to a target state (e.g., '00') of three of more states (e.g., '00', '01', '10', etc.) of the magnetic tunnel junction element and provide electrical current to modify a position of a domain wall of a free layer to correspond to the target state. For example, writing circuitry 721 defines the appropriate voltage to be applied to the bitlines. In this example, circuitry 705 controls the passing of the voltages from writing circuitry 721 output bitline 708 and bitline 709 to the various bitlines so that the write operation is applied to the correct magnetic tunnel junction element within the array of magnetic tunnel junction elements.

Figure 8:
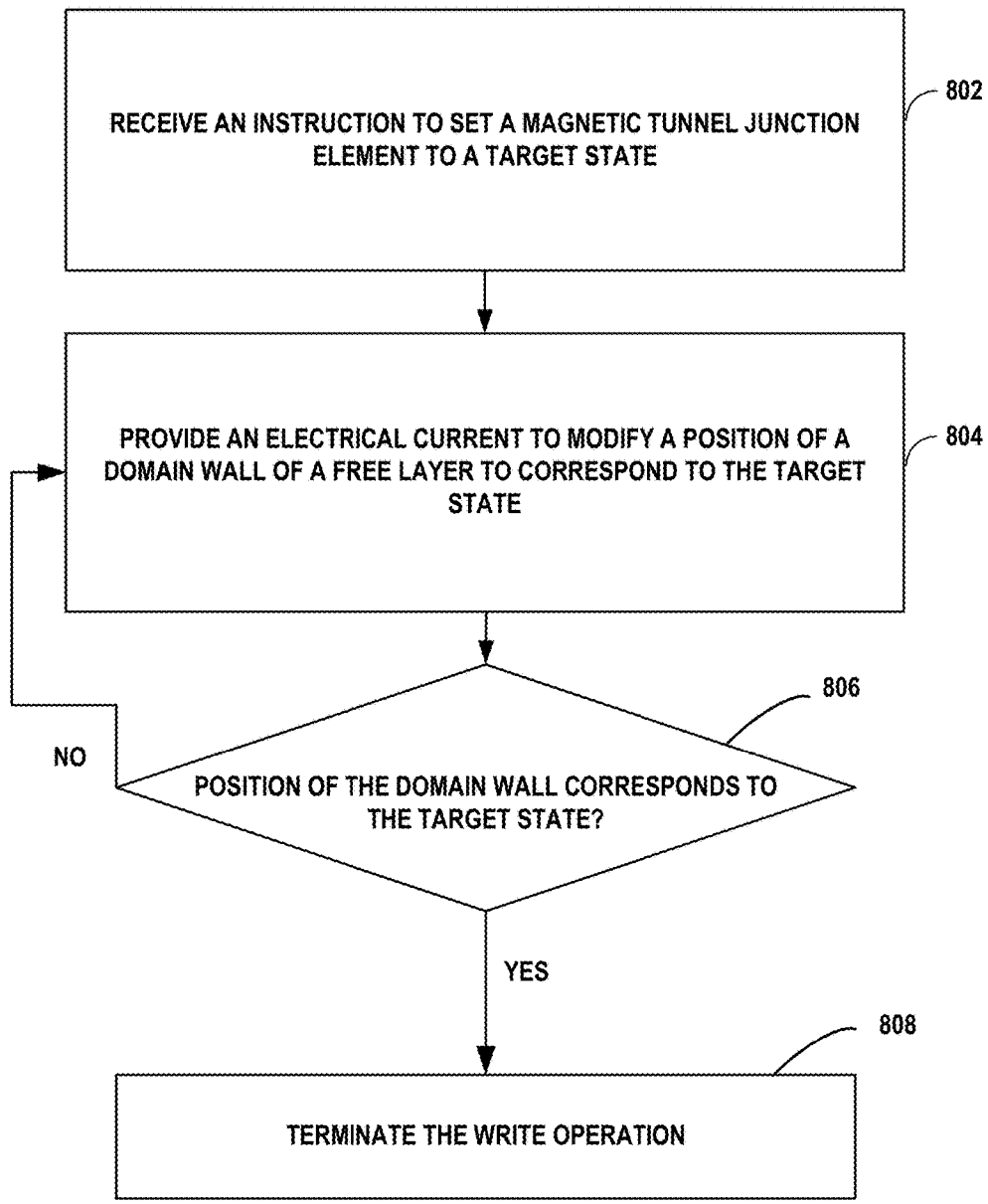
FIG. 8 shows a flowchart of a method of performing write operations on a magnetic tunnel junction element in accordance with the techniques of this disclosure.

FIG. 8 shows a flowchart of a method of performing write operations on a magnetic tunnel junction element in accordance with the techniques of this disclosure. The method of FIG. 8 may, for example, be performed by a magnetic tunnel junction element described above with respect to any combination of FIGS. 1-7. The device receives an instruction to set a magnetic tunnel junction element to a target state (802). The device provides an electrical current to modify a position of a domain wall of a free layer to correspond to the target state (804). The device can monitor a position of the domain wall (806) while the write operation is performed, and in response to detecting that the position of the domain wall corresponds to the target state (806, yes), the device can terminate the write operation (808). In response to detecting that the position of the domain wall does not correspond to the target state (806, no), the device can continue to perform the write operation (804).

The term "circuitry" as used herein may refer to any of the foregoing structure or any other structure suitable for processing program code and/or data or otherwise implementing the techniques described herein. Circuitry may, for example, any of a variety of types of solid state circuit elements, such as CPUs, CPU cores, GPUs, digital signal processors (DSPs), application-specific integrated circuits (ASICs), mixed-signal integrated circuits, field programmable gate arrays (FPGAs), microcontrollers, programmable logic controllers (PLCs), programmable logic device (PLDs), complex PLDs (CPLDs), systems on a chip (SoC), any subsection of any of the above, an interconnected or distributed combination of any of the above, or any other integrated or discrete logic circuitry, or any other type of component or one or more components capable of being configured in accordance with any of the examples disclosed herein.

As used in this disclosure, circuitry may also include one or more memory devices, such as any volatile or non-volatile media, such as a RAM, ROM, non-volatile RAM (NVRAM), electrically erasable programmable ROM (EEPROM), flash memory, and the like. The one or more memory devices may store computer-readable instructions that, when executed or processed the circuitry, cause the circuitry to implement the techniques attributed herein to circuitry. The circuitry of this disclosure may be programmed, or otherwise controlled, with various forms of firmware and/or software.

Various illustrative aspects of the disclosure have been described above. These and other aspects are within the scope of the following claims.

The invention claimed is:

1. A method for performing a write operation on a multi-state memory device, the method comprising:
receiving, by writing circuitry, an instruction to set a magnetic tunnel junction element to a target state of three or more states of the magnetic tunnel junction element, wherein the magnetic tunnel junction element includes a free layer, a pinned layer, and a tunnel barrier, the free layer being spaced apart along a vertical direction from the pinned layer by the tunnel barrier; and
providing, by the writing circuitry, electrical current to modify a position of a domain wall of the free layer along both a first horizontal direction and a second horizontal direction to correspond to the target state, the vertical direction being perpendicular to the first horizontal direction and the second horizontal direction, and the first horizontal direction being perpendicular to the second horizontal direction.

2. The method of claim 1, wherein the domain wall extends along the first horizontal direction from a first side of the free layer to a second side of the free layer that is opposite to the first side of the free layer and wherein providing the electrical current to modify the position of the domain wall comprises:
providing the electrical current to modify the position of the domain wall at the second side of the free layer and along the second horizontal direction to a target position relative to the position of the domain wall at the first side of the free layer, wherein the target position corresponds to the target state.

3. The method of claim 2, wherein the second side of the free layer includes three or more pinning sites that each correspond to one state of the three or more states of the magnetic tunnel junction element and wherein providing the electrical current comprises modifying the position of the domain wall to a pinning site of the three or more pinning sites that corresponds to the target state.

4. The method of claim 3, wherein at least one pinning site of the three or more pinning sites comprises a notch.

5. The method of claim 3, wherein each of the three or more pinning sites are arranged at a common position along the first horizontal direction and wherein each of the three or more pinning sites are spaced apart from other pinning sites of the three or more pinning sites along the second horizontal direction.

6. The method of claim 3, wherein a first pinning site of the three or more pinning sites and a second pinning site of the three or more pinning sites are arranged at a different positions along the first horizontal direction and wherein each of the three or more pinning sites are spaced apart from other pinning sites of the three or more pinning sites along the second horizontal direction.

7. The method of claim 1, wherein the domain wall extends along both the first horizontal direction and the second horizontal direction from a side of the free layer to a top of the free layer that is perpendicular to the side of the free layer and wherein providing the electrical current to modify the position of the domain wall comprises:
providing the electrical current to modify the position of the domain wall at the top of the free layer and along the side of the free layer that corresponds to the target state.

8. The method of claim 1, wherein the magnetic tunnel junction element comprises one or more stabilization components, each stabilization component arranged along only the first horizontal direction, along only the second horizontal direction, or along only the first horizontal direction and the second horizontal direction.

9. The method of claim 8, wherein the one or more stabilization components are arranged adjacent to the free layer.

10. The method of claim 8, wherein the one or more stabilization components are spaced apart from the free layer.

11. A magnetic tunnel junction based memory device, the device comprising:
a magnetic tunnel junction element comprising a free layer, a pinned layer, and a tunnel barrier, the free layer being spaced apart along a vertical direction from the pinned layer by the tunnel barrier; and
writing circuitry configured to:
receive an instruction to set the magnetic tunnel junction element to a target state of three or more states of the magnetic tunnel junction element; and
provide electrical current to modify a position of a domain wall of the free layer along both a first horizontal direction and a second horizontal direction to correspond to the target state, the vertical direction being perpendicular to the first horizontal direction and the second horizontal direction, and the first horizontal direction being perpendicular to the second horizontal direction.

12. The device of claim 11, wherein the domain wall extends along the first horizontal direction from a first side of the free layer to a second side of the free layer that is opposite to the first side of the free layer and wherein, to provide the electrical current to modify the position of the domain wall, the writing circuitry is configured to:
provide the electrical current to modify the position of the domain wall at the second side of the free layer and along the second horizontal direction to a target position relative to the position of the domain wall at the first side of the free layer, wherein the target position corresponds to the target state.

13. The device of claim 12, wherein the second side of the free layer includes three or more pinning sites that each correspond to one state of the three or more states of the magnetic tunnel junction element and wherein, to provide the electrical current, the writing circuitry is configured to modify the position of the domain wall to a pinning site of the three or more pinning sites that corresponds to the target state.

14. The device of claim 13, wherein at least one pinning site of the three or more pinning sites comprises a notch.

15. The device of claim 13, wherein each of the three or more pinning sites are arranged at a common position along the first horizontal direction and wherein each of the three or more pinning sites are spaced apart from other pinning sites of the three or more pinning sites along the second horizontal direction.

16. The device of claim 13, wherein a first pinning site of the three or more pinning sites and a second pinning site of the three or more pinning sites are arranged at a different positions along the first horizontal direction and wherein each of the three or more pinning sites are spaced apart from other pinning sites of the three or more pinning sites along the second horizontal direction.

17. The device of claim 11, wherein the domain wall extends along both the first horizontal direction and the second horizontal direction from a side of the free layer to a top of the free layer that is perpendicular to the side of the free layer and wherein, to provide the electrical current to modify the position of the domain wall, the writing circuitry is configured to:
provide the electrical current to modify the position of the domain wall at the top of the free layer and along the side of the free layer that corresponds to the target state.

18. The device of claim 11, wherein the magnetic tunnel junction element comprises one or more stabilization components, each stabilization component arranged along only the first horizontal direction, along only the second horizontal direction, or along only the first horizontal direction and the second horizontal direction.

19. The device of claim 18, wherein the one or more stabilization components are arranged adjacent to the free layer.

20. A magnetic tunnel junction based memory device comprising:
means for receiving an instruction to set a magnetic tunnel junction element to a target state of three or more states of the magnetic tunnel junction element, wherein the magnetic tunnel junction element includes a free layer, a pinned layer, and a tunnel barrier, the free layer being spaced apart along a vertical direction from the pinned layer by the tunnel barrier; and
means for providing electrical current to modify a position of a domain wall of the free layer along both a first horizontal direction and a second horizontal direction to correspond to the target state, the vertical direction being perpendicular to the first horizontal direction and the second horizontal direction, and the first horizontal direction being perpendicular to the second horizontal direction.

* * * * *